United States Patent
Vishnevsky et al.

[11] 4,019,073
[45] Apr. 19, 1977

[54] PIEZOELECTRIC MOTOR STRUCTURES

[76] Inventors: Vladimir Sergeevich Vishnevsky, ulitsa Ovruchskaya, 19, kv. 1; Vladimir Leonidovich Kavertsev, prospekt Voroshilova, 17a, kv. 24; Igor Alexandrovich Kartashev, pereulok Ivana Maryanenko, 7, kv. 22; Vyacheslav Vasilievich Lavrinenko, ulitsa A. Malyshko, 13, kv. 125; Mikhail Makarovich Nekrasov, prospekt Brest-Litovsky, 2, kv. 16a; Alexei Alexeevich Prez, ulitsa Bolshaya Podvalnaya, 28, kv. 15, all of Kiev, U.S.S.R.

[22] Filed: Aug. 12, 1975

[21] Appl. No.: 604,064

[52] U.S. Cl. ................ 310/8.2; 310/8.5; 310/8.6
[51] Int. Cl.² ........................................ H01L 41/04
[58] Field of Search ............... 310/8, 8.1, 8.3, 8.2, 310/26, 8.5, 8.6, 9.1

[56] References Cited
UNITED STATES PATENTS

| | | | |
|---|---|---|---|
| 3,176,167 | 3/1965 | Vossler | 310/8.3 |
| 3,192,415 | 6/1965 | Duff et al. | 310/8.3 |
| 3,204,133 | 8/1965 | Tschudin | 310/26 X |
| 3,211,931 | 10/1965 | Tehon | 310/8.3 |
| 3,225,226 | 12/1965 | Kawakami | 310/8.3 X |
| 3,297,889 | 1/1967 | Breskend | 310/8.3 |
| 3,343,010 | 9/1967 | Snaper | 310/26 X |

*Primary Examiner*—Mark O. Budd

[57] ABSTRACT

A piezoelectric motor, bases on utilization of the reverse piezoelectric effect for continuous conversion of electric power into mechanical energy of rotation of the rotor. The piezoelectric motor includes a rotor and a stator, at least one of them incorporating a vibrator of mechanical oscillation, having a piezoelectric device connected to a voltage source and converting electric power into mechanical vibrations. The piezoelectric motor contains no windings and provides considerable driving torques, owing to the stator and rotor being urged against each other. The structure of the piezoelectric motor is determined by the arrangement of the piezoelectric device in the rotor and stator, the type of oscillation being excited, the shape of the piezoelectric device, the arrangement of its electrodes, their shape and electrical connection, as well as by the polarization of the piezoelectric material. Various combinations of these features offer a great variety of structures and designs of the piezoelectric motors, the piezoelectric motor being supplied from a voltage source with supersonic frequency.

61 Claims, 55 Drawing Figures

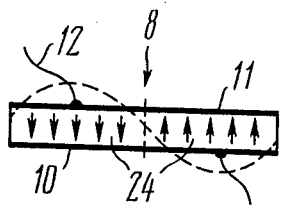 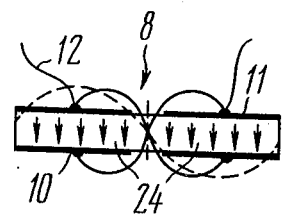
FIG. 26a  FIG. 26b
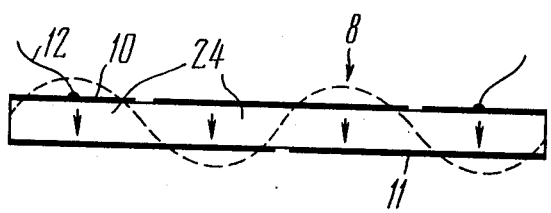
FIG. 27
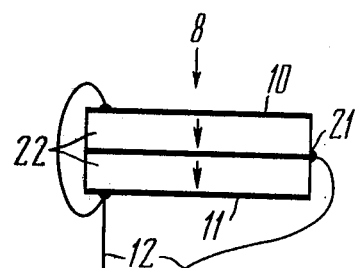 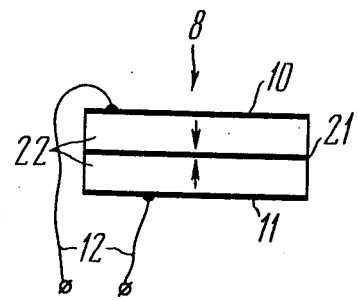
FIG. 28a  FIG. 28b
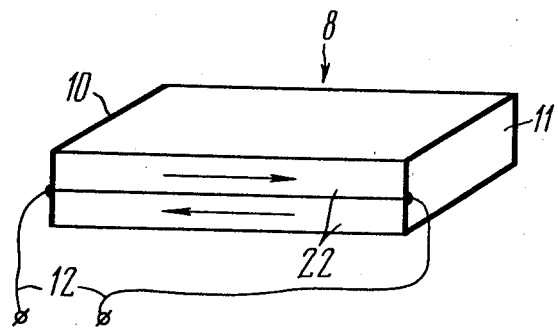
FIG. 29

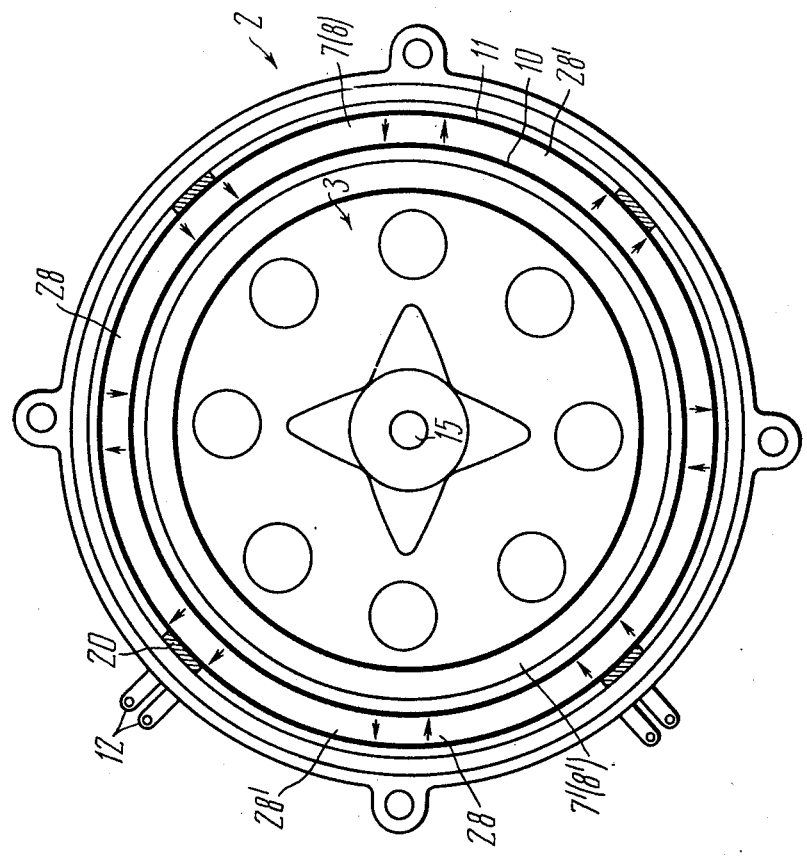
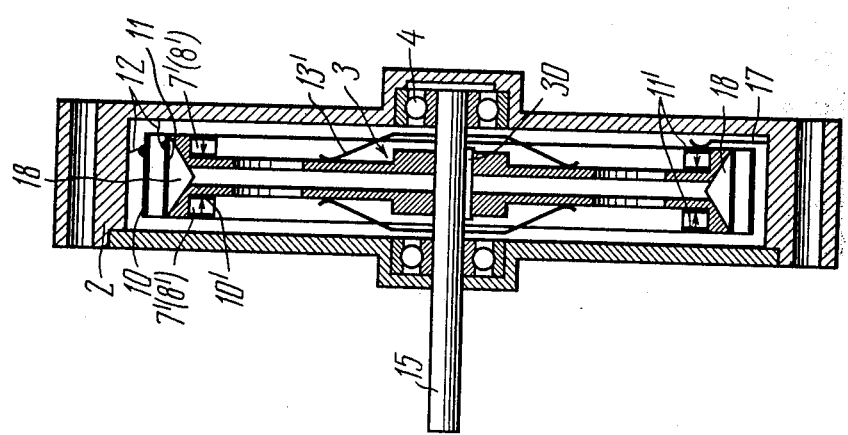
FIG. 36
FIG. 35

PIEZOELECTRIC MOTOR STRUCTURES

The present invention relates to the art of electric engineering and, more particularly, it relates to electric motors.

At present, there are widely known electric motors of continuous rotation, having a gap between the rotor and stator thereof, wherein the mechanical rotating torque applied to the rotor is provided by interaction of the electric and magnetic fields of the rotor and stator, the stator being formed by a part of the motor, which is stationary with respect to the base on which the motor is mounted, and the rotor being the rotating part of the motor, situated either internally of the stator in internal rotor motors or externally thereof in external rotor motors, in which latter case the rotor is journalled on the stator by means of bearings.

The known motors wherein the electric fields interact owing to the existence of Coulomb forces between the charges of the rotor and stator have no windings but are characterized by relatively low specific power ratings and low values of the efficiency factor. Therefore, as a rule, such motors are used practically only for demonstration purposes.

There are widely known motors operating by interaction between magnetic fields created by electric current flowing through the rotor winding and the stator winding, such motors being divided into two groups, viz. those where the current flowing through the rotor winding and that flowing through the stator winding are both produced by an external power source and those wherein the current flowing through the rotor winding is induced by the current flowing through the winding of the stator. In most cases the motors of the first group are direct-current motors and those belonging to the second group are alternating-current motors.

A serious drawback of motors of the last-described type is the presence therein of the windings, which complicates the manufacture of the motors and increases their cost. The power output at the shaft of such motors depends on the gap between the stator and rotor, whereby the cost of the motors grows as the requirements as to the accuracy of their manufacture become more strict. With a reduction of the power output of A.C. and D.C. motors the input resistance thereof diminishes on account of the diminising inductance of the windings, which calls for a corresponding reduction of the voltage of the power source, whereby additional voltage transformers are required, and thus the total cost of the equipment incorporating such motors is stepped up. Furthermore the abovedescribed motors usually feature high speeds of rotation, in most cases in excess of 1000 r.p.m., and therefore, in the majority of practical applications the motors are associated with costly reducers.

The high cost of motors with electromagnetic induction is also due to the complicated manufacture of their stators and rotors which are assembled of plates made of iron alloyed with expensive metals, such as nickel, manganese and others. The high specific weight of the rotor and stator materials and of the copper in the wires of the windings of the motor more often than not is the reason for inadequately high specific weight-related power output at the shaft of such motors, which is particularly true of motors having capacities below 10 Wt.

The high inertia moment of the rotor presents an obstacle to swift starting and stopping of the motor, the starting currents leaping up to great values tending to overload the supply mains. Among other drawbacks of such motors are the low cosine of loss angle, the noise and sparkling associated with the operation of the commutator, the inadequately high efficiency factor of low-capacity motors, the necessity of using costly bearings to provide for high speeds, the fact that the power ratings are affected by operation in rarefied air and vacuum, under high temperatures and in polluted atmosphere, the necessity of additional protection of the motors and the low operating frequency required by alternating-current motors.

However, despite all the abovelisted drawbacks, motors of the hereintofore described kind are broadly used, because no other hitherto known motors can compete with motors with electromagnetic excitation in the major parameters, such as the power output at the shaft and the efficiency factor.

It is an object of the present invention to eliminate the abovelisted drawbacks.

It is an object of the present invention to use piezoelectric devices capable of converting electric power into mechanical enerty to create a principally novel structure of an electric motor.

These and other object are attained in an electric motor comprising a stator and a rotor, wherein, in accordance with the present invention, at least one of the two includes at least one vibrator incorporating a piezoelectric device having the leads thereof connected to a voltage source, the stator and the rotor being pressed against each other at least at one point on the surface of the vibrator, in order to transmit the torque.

The rotor of the motor is mounted on the stator by means of at least one bearing.

To ensure continuous contact between the rotor and the stator, at least the rotor of the motor is shaped as a body having a portion of its surface, engaging the stator, formed by rotation of at least one stretch of a straight line about the axis of the rotation of the rotor. It is expedient that the stator should be shaped as a body having a portion of its surface, engaging the rotor, formed by rotation of at least one stretch of a straight line about the axis of rotation of the rotor.

It is expedient that the entire rotor should be shaped as a body of rotation about the axis of rotation of the rotor.

The stator of the motor can be in the form of the vibrator.

The vibrator can be mounted on a support with the help of a substance characterized by the product of the density thereof by the Young modulus thereof being smaller than one tenth of the similar product calculated for the material of the piezoelectric device of the vibrator.

The stator of the motor can incorporate a vibrator generating longitudinal oscillation, as well as radial oscillation.

The stator can incorporate a vibrator generating longitudinal oscillation and bending oscillation, as well as a vibrator generating torsional and radial oscillation, a vibrator generating torsional and longitudinal oscillation, a vibrator generating shear oscillation along two perpendicular directions, a vibrator generating shear oscillation and longitudinal oscillation.

The rotor of the motor can incorporate a vibrator generating radial oscillation, a vibrator generating shear oscillation, a vibrator generating torsional oscillation.

The vibrator can be secured to the support thereof in at least one minimum of the oscillation speeds.

The vibrator of the stator can be in the form of a piezoelectric device.

The vibrator of the rotor can be likewise in the form of a piezoelectric device.

The piezoelectric device of the vibrator of the stator can be provided in the area of engagement of the rotor and the stator with a lining of a wear-resistant material acoustically connected with the piezoelectric device.

The vibrator can be in the form of a rectangular plate.

The vibrator of the stator can be in the form of a rod with a diminishing cross-section, the rotor engaging the vibrator at the end of the rod having the minimal cross-section.

The vibrator of the stator can be in the form of a convolution of a spiral, the rotor being positioned intermediate of the ends of this convolution of a spiral.

The vibrator of the stator can be in the form of a hollow cylinder, as well as in the form of a cylinder which is not hollow.

The piezoelectric device of the vibrator can have the shape of the vibrator.

The lining of a wear-resistant material can be in the form of a thin-wall cylinder.

The piezolelectric device can be formed by two layers acoustically connected to each other and separated by at least one electrode.

The surface of one of the electrodes can have a layer of metal acoustically connected thereto.

The piezoelectric device can incorporate a ferroelectric piezoelectric material.

The piezoelectrical device can be made of a ceramic material.

The piezoelectric device can be polarized either perpendicularly to the electrodes theeof or parallel with the electrodes thereof.

The rotor and the stator are urged against each other by at least one resilient member, e.g. a spring.

The resilient member can have one end thereof mounted on the support of the vibrator and the other end thereof mounted on the vibrator itself.

The resilient member can have the ends thereof mounted on two vibrators of the stator; alternatively, it can be mounted on the rotor.

The electrodes of the piezoelectric device of the vibrator belonging to the rotor can have voltage supplied thereto from a voltage source through siliently biased contacts.

The electrodes can be coated on the cylindrical surfaces of a hollow cylinder polarized in a direction perpendicular to these electrodes.

The piezoelectric device can be in the form of a disc polarized across the thickness thereof, with the electrodes provided on the main faces of the disc.

The layers of the piezoelectric device can extend parallel with the external electrodes and be connected in parallel with one another, the adjacent layers being polarized in opposing directions.

The rotor can be received within the stator in the form of a hollow cylinder having plates mounted internally thereof symmetrically with respect to the axis of rotation of the rotor, each plate having one its end secured to the stator and the other end thereof bearing upon the rotor.

The stator can be received about the rotor having plates secured to the shaft thereof by their ends, the plates extending symmetrically with respect to the axis of rotation of the rotor and having the other ends thereof bearing upon the surface of the stator.

The rotor can be received symmetrically between two parallel piezoelectric plates urged to the rotor by two springs mounted on frames in which the plates are mounted, each frame being positioned at a distance of one fourth of the length of the plate from the end thereof, the frames being freely movable in four grooves of a support, the plates having electrodes on the main faces thereof and being polarized the thickness thereof in two opposite directions and being polarized in one direction relative to each other, both the internal electrodes and the external ones being connected to one another.

The piezoelectric device of the stator can symmetrically envelope the rotor therein the can have electrodes on the cylindrical surfaces thereof, the device being polarized perpendicularly to these electrodes in opposing directions so that this polarization divides the device into an even number of equal parts, linings made of a wear-resistant material being mounted at the interfaces between these parts internally of the piezoelectric device and symmetrically, the number of these linings being one half of the number of said parts.

There can be mounted on the shaft of the rotor symmetrically with respect to the stator two piezoelectric devices having electrodes on the side surfaces thereof, the devices being movable axially and being polarized perpendicularly to these electrodes, said piezoelectric devices being urged to the linings of the stator, made of a wear-resistant material, the linings being shaped in cross-section as isosceles triangles, both the external and internal electrodes of the piezoelectric devices being interconnected, the piezoelectric devices being polarized in opposite directions relative to each other.

The stator can include two vibrators in the form of two-layer piezoelectric plates with openings, the rotor being pressed to these plates and having the shaft thereof extending through these openings, the piezoelectric device being a vibrator generating the second overtone of longitudinal oscillation longitudinally of the plate and the second overtone of bending oscillation across the width of the plate.

The piezoelectric device can have the common electrode connected to one pole of the voltage source and one electrode for exciting one type of oscillation, connected to the other pole of the voltage source, as well as the second electrode for exciting another type of oscillation connected through a two-way selector switch to the first electrode both directly and through an invertor, e.g. through a voltage transformer. Out of the four electrodes of the motor two are meant for exciting one type of oscillation and are connected to the voltage source and the other two are meant for exciting another type of oscillation and are connected to the voltage source through a bi-polar two-way selector switch.

The piezoelectric device can include at least one additional electrode connected to a load.

The vibrator of the stator can include a two-layer piezoelectric device having two electrodes in each layer plane, forming within the piezoelectric device two electrically unconnected zones, with the layers being polarized within one zone in one direction and within the other zone in opposite directions, the external conductive coatings of each zone being interconnected.

The motor can contain at least one additional rotor urged against the stator.

It is possible to mount on the rotor shaft, passing through the stator, symmetrically at both sides of the stator two bodies of rotation, movable axially, each body being, for example, a truncated cone having an opening and a groove for mounting of this body on said rotor shaft, the two bodies being urged against the lateral sides of the stator.

The stator of the motor can be provided woth two vibrators, each having one its end pivotably mounted, there being arranged between these vibrators a rotor biased against the end of one of the vibrators by means of a reversing arrangement.

The reversing arrangement can be in the form of an electromagnet, a part of the electromagnet being mounted on the end of one of the vibrators.

When the herein disclosed electric motor is operated as a power generator, the rotor thereof is coupled to a drive adapted to rotate the rotor, at least one pair of the electrodes of at least one vibrator, serving to excite one type of oscillation, being in this case connected to an electric load.

A second pair of the electrodes of which one is the electrode also belonging to the first pair can be connected to a source of A.C. voltage of a frequency which is the working frequency of the motor.

A second pair of the electrodes serving to excite another type of oscillation can be connected to a source of A.C. voltage of a frequency which is the working frequency of the motor.

The herein disclosed piezoelectric motor is a new type of winding-less motors. With the motor having no windings, its manufacture is both simplified and less labor consuming.

Furthermore, it has become possible to cut down the use of costly materials in the herein disclosed piezoelectric motor, as compared with motors with windings. Correspondingly, the cost of the motors has been reduced.

With the piezoelectric motor having one of the abovespecified structures, the ratings of low-power motors are substantially improved. Thus, in comparison with electromagetic A.C. motors, piezoelectric motors with power output below 10 W have the efficiency factor that is two to three times greater. The overall dimensions of the motor have been reduced, too, and it is possible to have the motor shaped as a flat structure, or else as a body elongated in a single direction. With piezoelectric motors the creation of a low-speed motor presents no problem, whereby the motor does not require a speed reducer which otherwise would have complicated the structure and increased the cost of the motor assembly. Piezoelectric motors feature relatively great starting torques and low inertia moment values, which ranks them above their electromagnetic counterparts and enhances their employment in various automation systems.

Another advantageous use is the employment of piezoelectric motors as low-capacity power generators which, the same as the motors, are of smaller dimensions, simple and reliable.

The present invention will be further described in connection with embodiments thereof, with reference being had to the accompanying drawings, wherein.

Figure 20A:
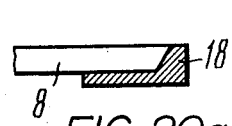
Figure 20B:
Figure 20C:
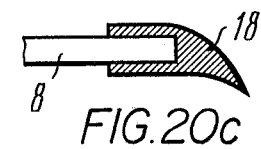
Figure 21:
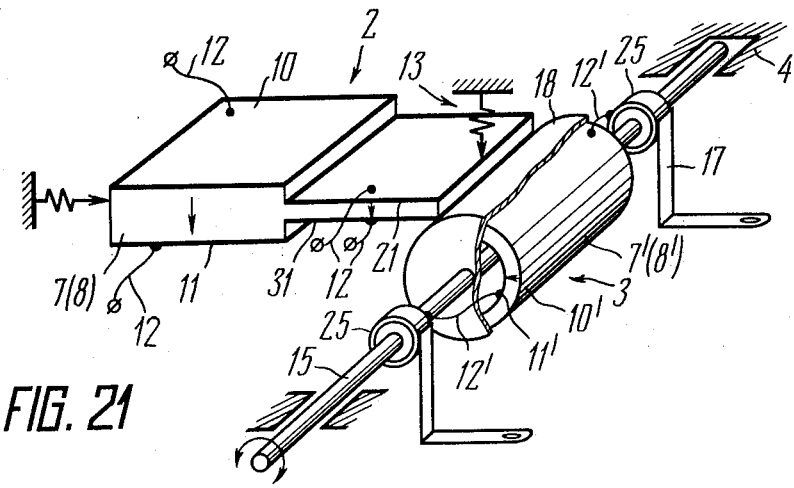

FIG. 20A-C illustrates the profiles of wear-resistant linings secured on the vibrators, according to the invention;

FIG. 21 shows the structure of a piezoelectric motor wherein the vibrator of the stator has varying cross-section, according to the invention.

Figure 22:
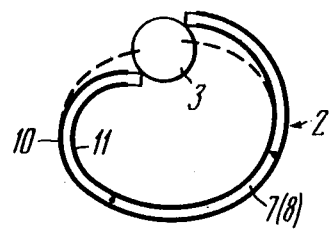
Figure 23:
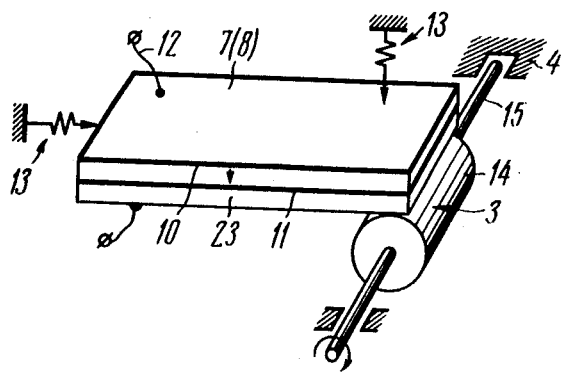
Figures 24A, 24B, 24C:
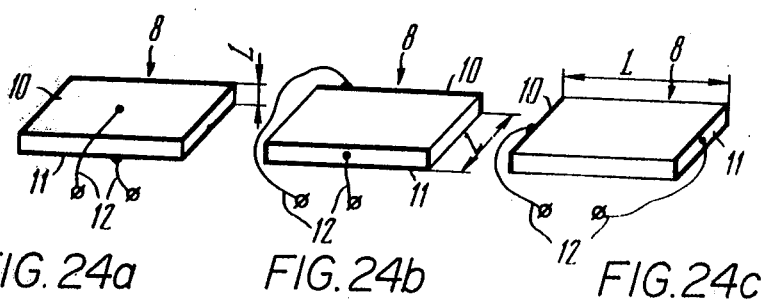
Figure 25A:
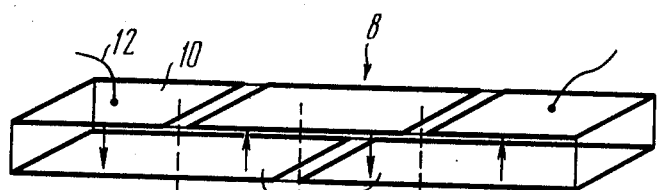
Figure 25B:
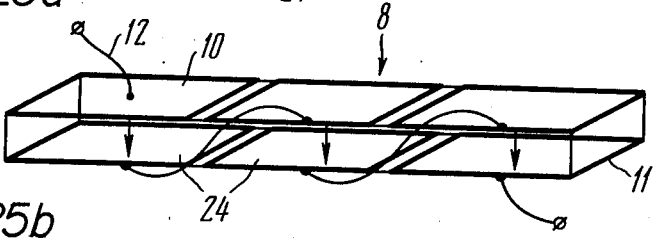
Figure 37:
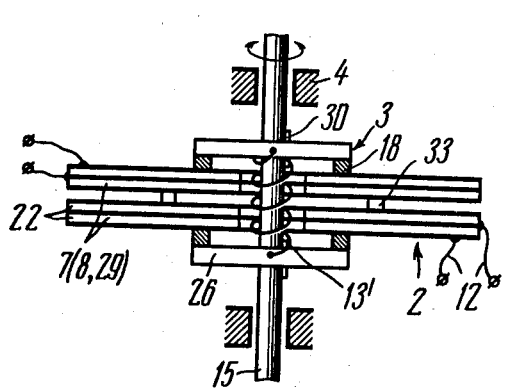
Figure 38:
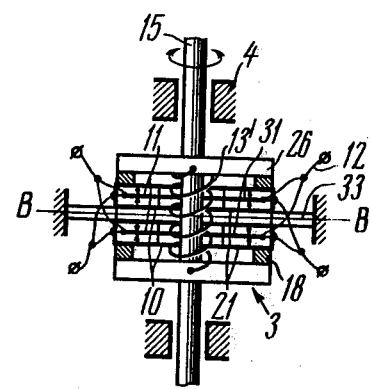
Figure 30:
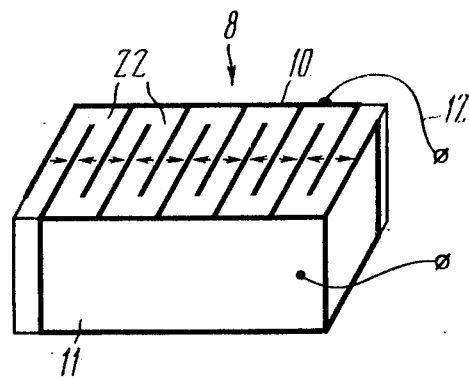
Figure 31:
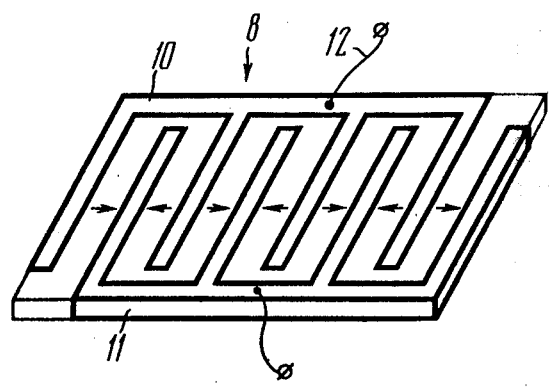
Figure 32:
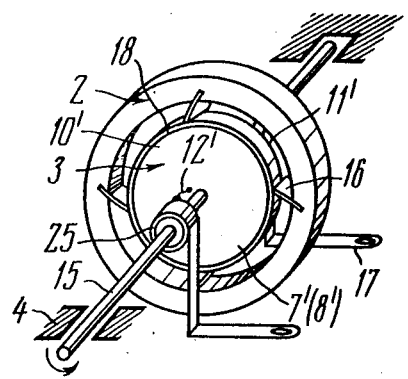
Figure 33:
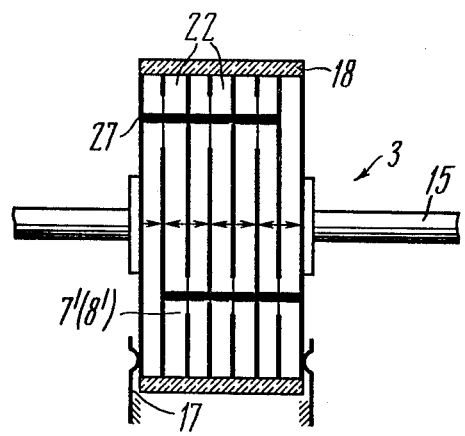
Figure 34:
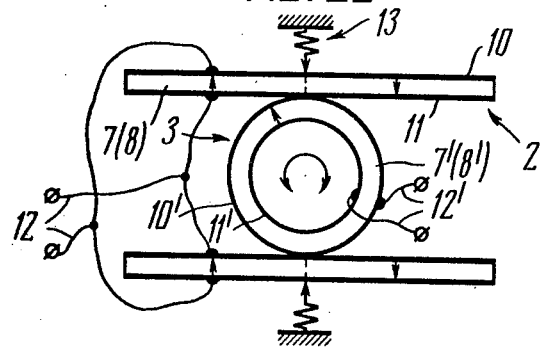
Figure 39:
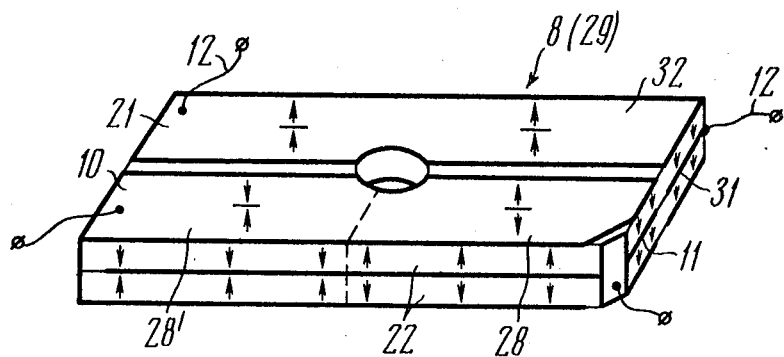
Figure 40:
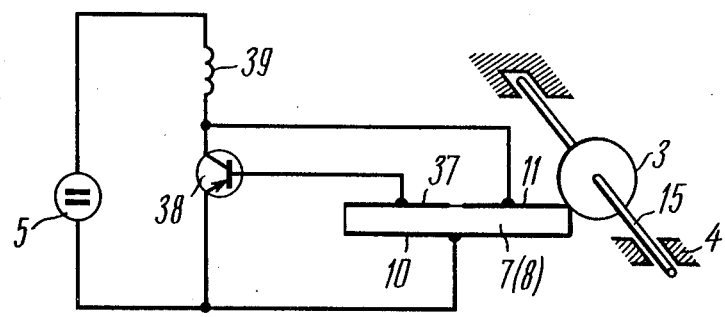
Figure 41:
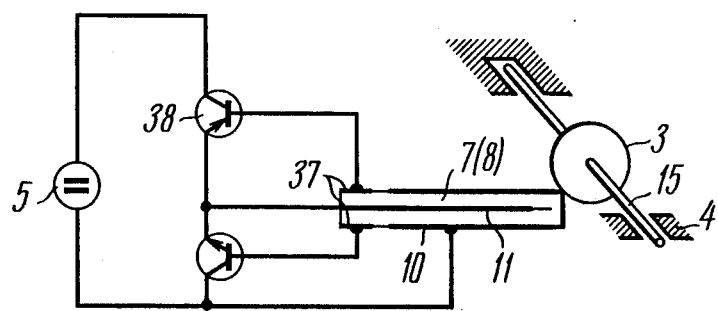
Figure 42:
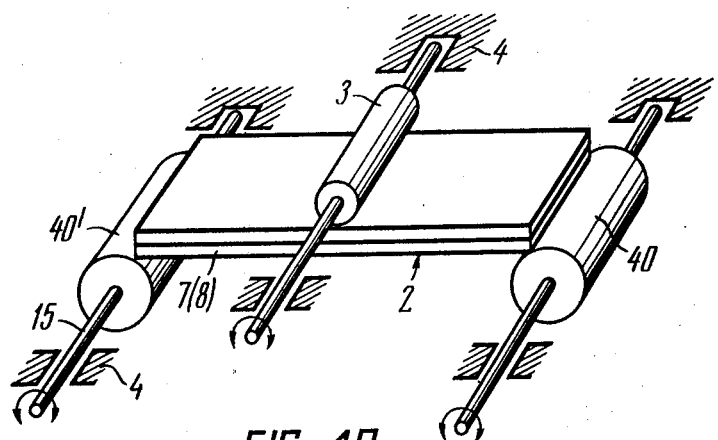
Figure 43:
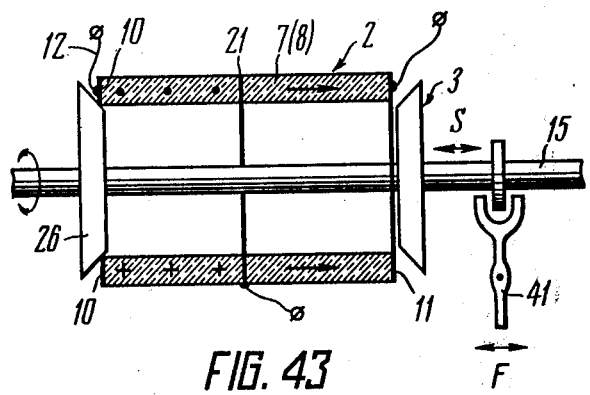
Figure 44:
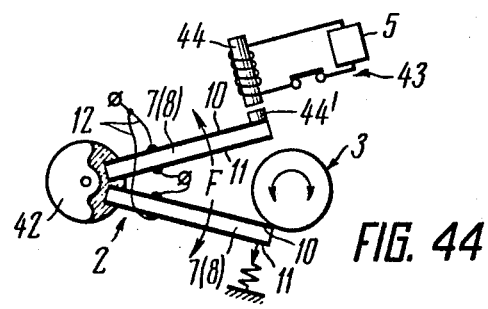
Figure 45:
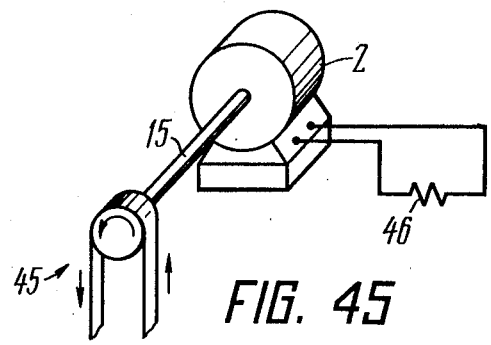
Figure 46:
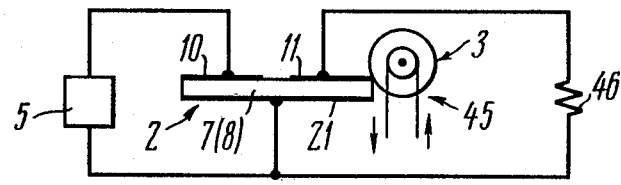
Figure 47:
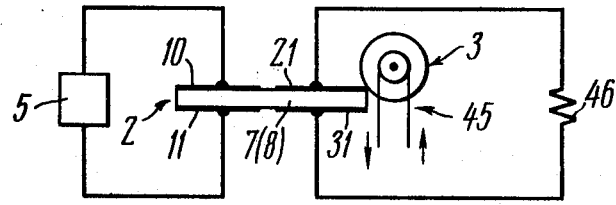
Figure 48:
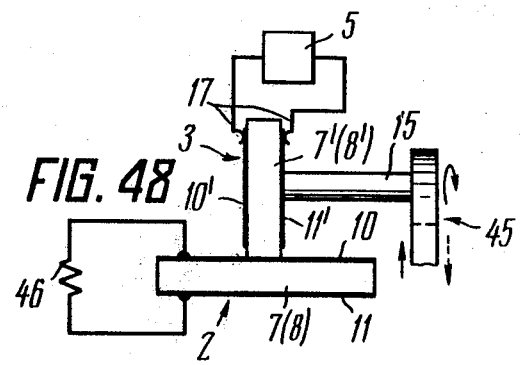

FIG. 22 shows the structure of a piezoelectric motor wherein the vibrator of the stator is shaped as a convolution of a spiral, according to the invention;

FIG. 23 shows the structure of a piezoelectric motor wherein the vibrator of the stator includes a metal layer, according to the invention;

FIG. 24A-C shows the configuration of the electrodes on the surface of the piezoelectric devices, according to the invention;

FIG. 25A-B shows the piezoelectric device of the vibrator, including several serially connected zones, according to the invention;

FIG. 26A-B illustrates several modes of polarization of the zones of the piezoelectric device, according to the invention;

FIG. 27 illustrates serial connection of the zones of the piezoelectric device adapted to be excited at the fourth overtone of acoustic oscillation;

FIG. 28A-B illustrates connection of the layers of a two-layer bend-type piezoelectric device according to the invention;

FIG. 29 illustrates a two-layer bending-type piezoelectric device with the electrodes on its end faces, according to the invention;

FIG. 30 illustrates parallel connection of the electrodes of the piezoelectric device including several layers, according to the invention;

FIG. 31 illustrates parallel connection of the electrodes of the piezoelectric device, arranged on its surface, according to the invention;

FIG. 32 shows a modification of the structure of a piezoelectric motor with a passive stator, according to the invention;

FIG. 33 shows a multilayer vibrator shaped as a cylinder, according to the invention;

FIG. 34 shows the structure of a piezoelectric motor with an active rotor and an active stator, wherein the rotor is shaped as a hollow cylinder, according to the invention;

FIG. 35 is a side view of the structure of a piezoelectric motor with an active rotor and an active stator shaped as bodies of rotation, according to the invention;

FIG. 36 is a front view of a structure of the piezoelectric motor illustrated in FIG. 35;

FIG. 37 shows a modification of the structure of a piezoelectric motor according to the invention;

FIG. 38 is a side view of the structure of the piezoelectric motor illustrated in FIG. 37;

FIG. 39 shows a two-layer piezoelectric device adapted to generate longitudinal oscillation and bending oscillation, according to the invention;

FIG. 40 and FIG. 41 illustrate the simplest direct-to-alternating current voltage converters adapted to supply piezoelectric motors in accordance with the invention;

FIG. 42 shows the structure of a piezoelectric motor with auxiliary rotors, according to the invention;

FIG. 43 shows the structure of a mechanically reversible piezoelectric motor, according to the invention;

FIG. 44 shows the structure of a piezoelectric motor wherein the reversing arrangement includes an electromagnet, according to the invention;

FIG. 45 shows a circuit wherein the piezoelectric motor is connected to operate as a power generator, according to the invention;

FIG. 46 shows a circuit wherein the piezoelectric motor with three electrodes is connected to operate as a power generator, according to the invention;

FIG. 47 and FIG. 48 show the circuits wherein reversible piezoelectric motors with two pairs of electrodes are connected to operate as power generators.

Referring now in particular to the appended drawing, the herein disclosed electric motor includes, in principle, a part which is stationary with respect to a base 1 (FIG. 1), i.e. the stator 2 and a rotary part, i.e. the rotor 3 mounted on the stator 2 for rotation by means of a bearing 4. The motor is connected to a power source 5 either directly or through a phase-shift device 6 which provides for reversing the rotation of the motor electrically, whenever needed. Since in the herein disclosed motors electric power is converted into the mechanical power of rotation of the rotor by means of piezoelectric devices, such motors have been named piezoelectric motors.

Figure 2:
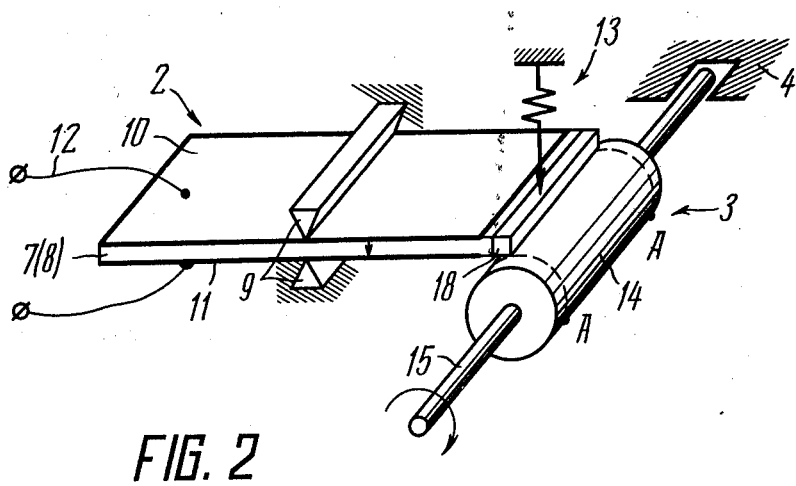
FIG. 2 shows the structure of a piezoelectric motor with a passive rotor, according to the invention.
Figure 3:
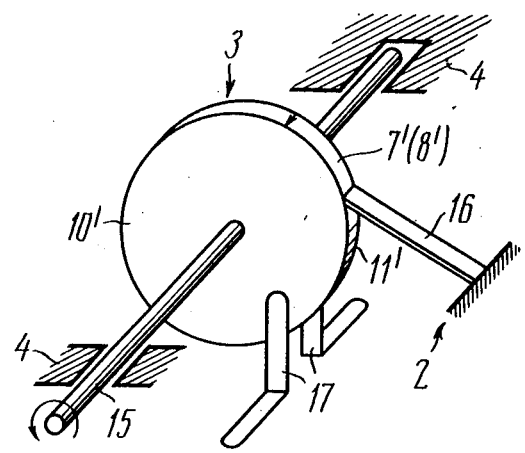
FIG. 3 shows the structure of a piezoelectric motor with a passive stator, according to the invention.
Figure 4:
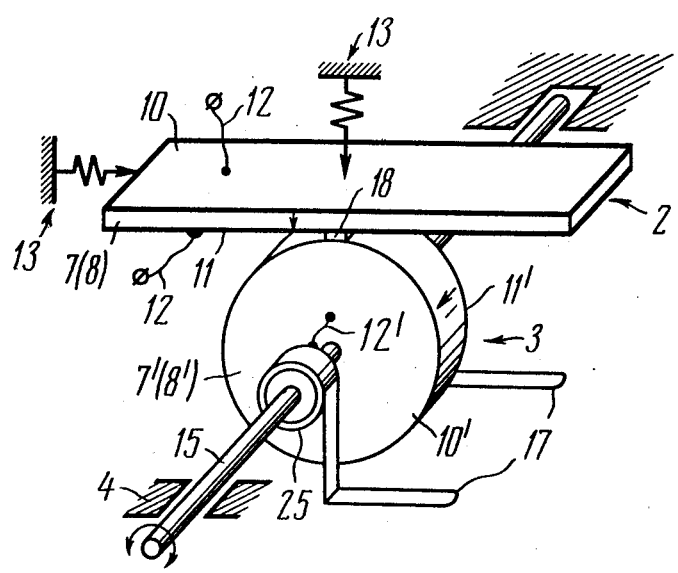
FIG. 4 shows the structure of piezoelectric motor with an active rotor and an active stator, according to the invention.
Figure 5:
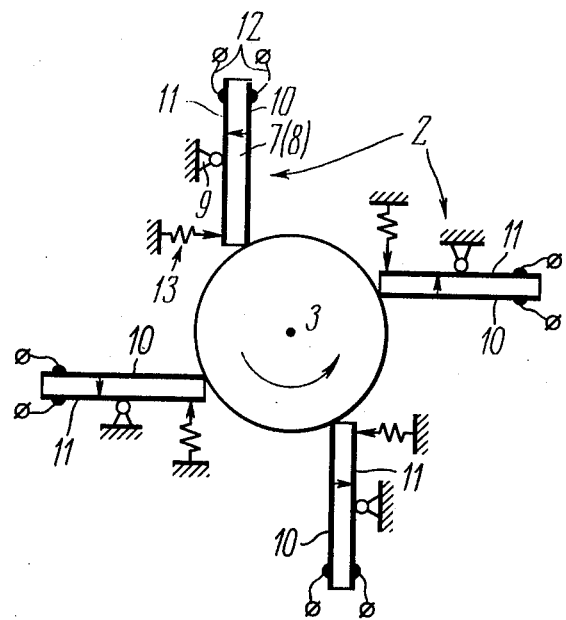
FIG. 5 shows the structure of a piezoelectric motor with several vibrators in the stator, according to the invention.

A substantial and necessary feature of the herein disclosed piezoelectric motor is that the stator 2 thereof includes at least one vibrator 7 (FIGS. 2, 4, 5) and/or the rotor 3 thereof includes at least one vibrator 7' (FIGS. 3 and 4). The vibrator 7 of the stator 2 includes a piezoelectric device 8 (FIGS. 2, 4 and 5). The vibrator 7' of the rotor 3 likewise includes a piezoelectric device 8' (FIGS. 3 and 4). The direction of polarization within the piezoelectric devices 8 and 8' is indicated with arrows in all the appended drawings. In the present disclosure the expression "a vibrator" is meant to describe an acoustic resonator incorporating a piezoelectric device, capable of stoping mechanical energy in the form of elastic oscillation.

In the disclosure to follow a stator or a rotor having either one or several vibrators, and, consequently, either one or several piezoelectric devices is going to be referred as piezoelectrically active, meaning that in this stator or rotor, owing to reverse piezoelectric effect, electric power is converted into mechanical power.

If a stator or a rotor includes no vibrators, no mechanical oscillation is generated therein by electric power. Hence, a rotor or a stator not incorporating a single vibrator will be referred to as piezoelectrically passive or simply passive.

To step up the capacity of the piezoelectric motor, the stator 2 includes several vibrators 7 each being urged to the rotor 3 (FIG. 5), for instance, by one its end.

Figure 6:
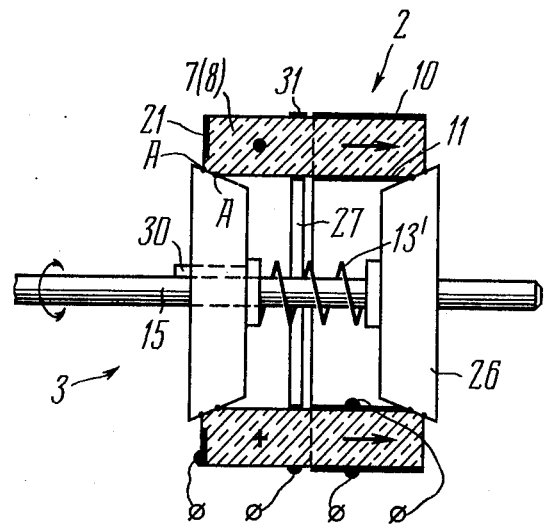
FIG. 6 shows the structure of a piezoelectric motor with the stator completely in the form of a vibrator, according to the invention.

To provide for transmission of the driving torque, the stator 2 and the rotor 3 are urged one against the other. Their engagement takes place along a straight line belonging to the surface of the vibrator 7 (or 7'). It is expedient hat at least the rotor 3 should be shaped so that a portion of the surface thereof, engaging the stator 2, should be formed by rotation of at least one stretch of a straight line A-A about the axis of rotation of the rotor 3 (FIG. 2). This requirement is also met when the entire rotor 3 is shaped as a body or rotation about the axis of rotation thereof. However, if this requirement cannot be met for some reason, the stator should be shaped so that a portion thereof engaging the rotor 3 should be formed by rotation of at least a stretch of straight line A—A about the axis of rotation of the rotor 3 (FIG. 6).

Three major modifications of the herein disclosed piezoelectric motor are dealt with in the present disclosure.

According to the first modification, the piezoelectric motor includes a stator 2 (FIG. 2) incorporating the holders 9 of the vibrator 7 and a bearing 4, the vibrator 7 including the piezoelectric device 8. The latter is in the form of a plate with electrodes 10 and 11 provided at the opposite sides of the plate. The outgoing leads 12 of the electrodes 10 and 11 are connected to a voltage source (not shown).

The stator 2 is urged against the rotor 3 by a pressure member 13 which also belongs to the stator structure 2. The holders 9, the pressure member 13 and the bearing 4 are mounted on the housing of the piezoelectric motor (the housing is not shown in the appended drawings). The rotor 3 in the presently described modification of the piezoelectric motor is shaped as a cylinder 14 mounted on a rotor shaft 15, the rotor 3 engaging the stator 2 along a straight line. Since in the presently described embodiment the rotor 3 is piezoelectrically passive, this motor will be referred to as a piezoelectric motor with a piezoelectrically passive rotor, or simply with a passive rotor.

According to the second modification of the piezoelectric motor, the stator 2 (FIG. 3) includes at least one plate 16 of a solid resilient material having one end thereof urged against the vibrator 7' of the rotor 3. This motor will be referred to as a piezoelectric motor with a piezoelectrically passive stator, or simply with a passive stator. The vibrator 7' of the rotor 3 is shaped as a body of rotation and is mounted on the shaft 15. In this embodiment the vibrator 7' includes solely the piezoelectric device 8', the electrodes 10' and 11' of which are connected through wiper contacts 17 to a voltage source (not shown). The bearing 4, the plate 16 and the wiper contacts 17 are mounted on the housing of the piezoelectric motor.

According to the third modifications illustrated in FIG. 4 both the stator 2 and rotor 3 include, respectively, the vibrators 7 and 7', and this motor will be referred to as a piezoelectric motor with piezoelectrically active rotor and stator, or simply with active rotor and stator.

In the herein disclosed structure of the piezoelectric motor with piezoelectrically active rotor and stator the vibrator 7' of the rotor 3 incorporates the piezoelectric device 8' shaped as a disc. The outgoing leads 10' and 11' of the piezoelectric device 8' of the rotor 3 are connected via the wiper contacts 17 to a voltage source. The vibrator 7 of the stator 2 includes the piezoelectric device 8 which is urged to the rotor 3, with the lining 18 interposed, by means of the pressure member 13.

The bearings 4, the pressure members 13, the wiper contacts 17 which all belong to the stator structure 2 are mounted on the body of the stator 2.

Depending on requirements put before a piezoelectric motor, the stator and the rotor thereof can be of various structures. To simplify the design of the piezoelectric motor, it is expedient that the stator 2 should be in the form of the vibrator and the rotor 3 should be mounted in the stator 2 without any specific bearings (FIG. 6).

However, in numerous other possible structures the vibrator 7 (FIGS. 7 and 8), as well as the bearings 4 are mounted on the support structure 19 of the stator 2, the vibrator 7 being secured in the support 19 through an insulating layer 20 which insulates the vibrator 7 acoustically from the support 19. The substance making up this insulating layer 20 can be any solid material of which the product of the density by the Young modulus is less than one tenth of the product of the density of the material of the vibrator 7 by the Young modulus thereof. For example, this substance can be rubber, cork, wood, etc.

Figure 7:
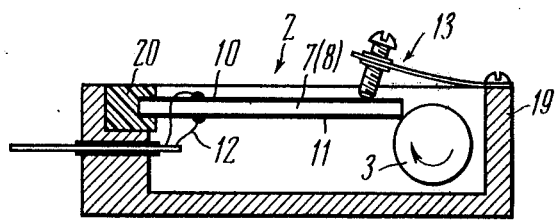
FIG. 7 is a side view of the structure of a piezoelectric motor wherein the rotor and the stator are mounted on a support, according to the invention.
Figure 8:
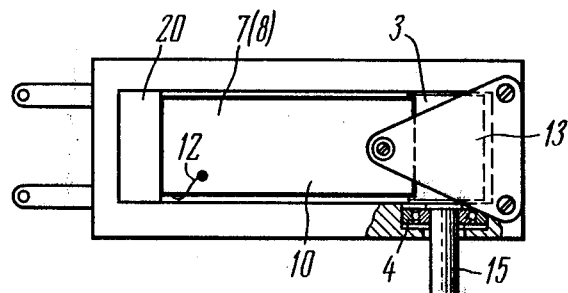
FIG. 8 is a plan view of the piezoelectric motor illustrated in FIG. 7.

The piezoelectric motor illustrated in FIGS. 7 and 8 has the insulating layer thickness of about 0.5 mm, and the motor yields satisfactory characteristics. The better the quality of acoustic insulation of the vibrator 7 from the support 19, the higher is the efficiency factor of the piezoelectric motor, which, according to the experimental and calculation data is two to three times higher than that of any known motor of a capacity below 10 W.

The characteristics and parameters of piezoelectric motors depend to a great degree on the structure of the vibrator.

There are known vibrator structures adapted to generate longitudinal oscillation, radial oscillation, bending oscillation, shear oscillation, torsional oscillation, as well as those generating the above types of oscillation in various combinations (see, for example, "Ultrasonic Transducers", edited by Yoshimitu Kikuchi, Prof., Research Institute of Electric Communication, Tohoki University, Corona Publishing Company Ltd., Tokyo, 1969).

It should be noted than in the abovementioned vibrator structures acoustic oscillation is excited simultaneously in several directions; thus, when the vibrator 7 is in the form of a plate (FIGS. 2 and 4), the oscillation is excited longitudinally of the plate, across the width and thickness thereof simultaneously; when the vibrator 7 (7') is shaped as a disc (FIGS. 3 and 4) or as a cylinder (FIG. 6), the oscillation is excited simultaneously, radially, across the thickness of the disc and along the generatrix of the cylinder. Mechanical elastic waves propagate in the above directions, too. If the size of the vibrator is such that an integer of half-waves —mechanical oscillation—occupies the dimension in one of the above directions, a resonance of mechanical oscillation takes place. If the dimension in this direction houses one half-wave, the first overtone resonance is preferred to, if there are two half-waves, the second overtone resonance is referred to, if there are three half-waves — the third overtone, and so on.

Besides, parasitic oscillation may also be excited in the vibrator. The parasitic oscillation beings about reduction of the factor of electromechanical coupling of those types of oscillation which are necessary for operation of the motor, to be hereinafter referred to as operative oscillation. Thus, in the vibrator besides the operative types of oscillation, i.e. torsional and longitudinal, propagating, e.g. along the generatrix of the cyliner, there are also excited parasitic types of oscillation, e.g. parasitic radical oscillation. Therefore, when we call a vibrator, for example, a vibrator of longitudinal oscillation, we mean that only the longitudinal oscillation is the operative oscillation.

Figure 11:
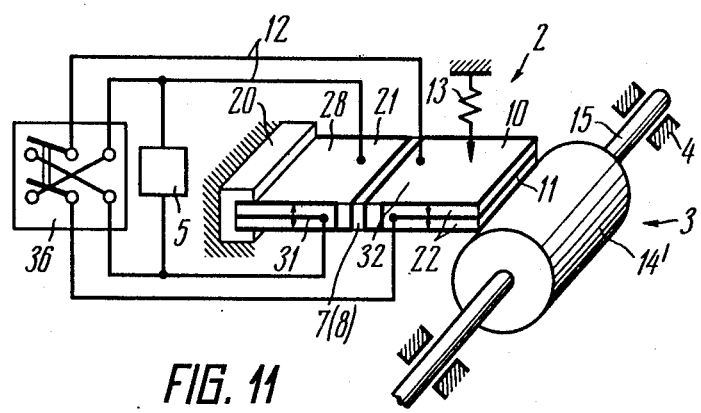
FIG. 11 illustrates the connection circuit of a reversible piezoelectric motor, wherein in the vibrator of the stator there are generated two types of oscillation, according to the invention.
Figure 12:
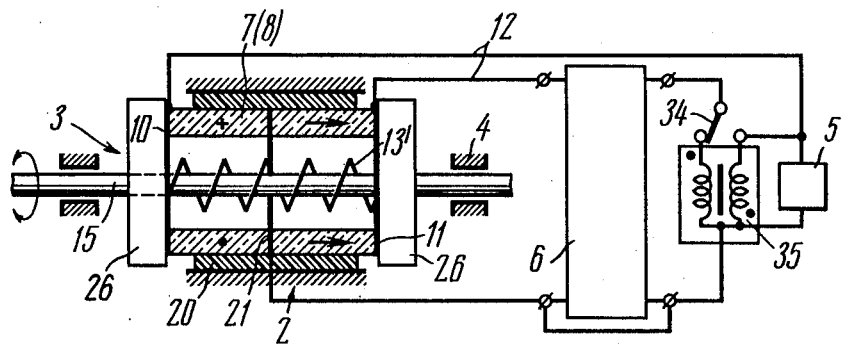
FIG. 12 shows the structure of a piezoelectric motor with an urging member arranged on the shaft of the rotor, according to the invention.
Figure 13:
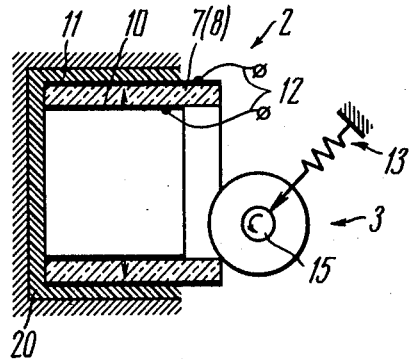
FIG. 13 shows the structure of a piezoelectric motor wherein there are generated in the vibrator of the stator longitudinal and radial types of oscillation according to the invention.

It is expedient that the stator 2 of the piezoelectric motors should incorporate the vibrator 7 which is either a vibrator of longitudinal oscillation (FIGS. 2, 5, 7, 8), or a vibrator of radial oscillation (FIGS. 9 and 10), a vibrator exciting simultaneously longitudinal and bending oscillation (FIG. 11), or else a vibrator exciting simultaneously torsional and longitudinal oscillation (FIG. 12). However, it is also possible to generate in the vibrator 7 of the stator 2 longitudinal and radial oscillation simultaneously (FIG. 13), or else to generate therein shear oscillation in two perpendicular directions viz. across the thickness of a hollow cylinder and about the circumference thereof (FIG. 14); in the structure wherein the vibrator is in the form of a plate (FIG. 15) the stator 2 incorporates the vibrator 7 generating longitudinal oscillation and shear oscillation.

Figure 16:
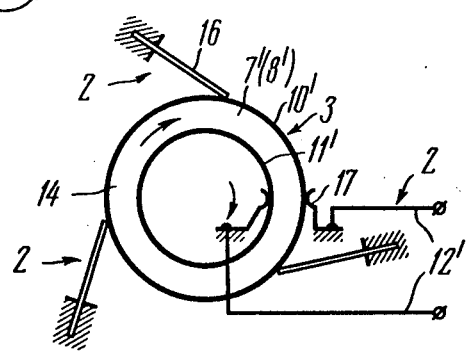
FIG. 16 shows the structure of piezoelectric motor wherein the vibrator of the rotor is shaped as a hollow cylinder, according to the invention.

The vibrator 7' of the rotor 3 can be a vibrator of radial oscillation (FIGS. 3 and 4). To provide for an increased frequency of the supply voltage, the vibrator 7' of the rotor 3 is in the form of a vibrator of shear oscillation (FIGS. 16, 17) On the other hand, to provide for a lower frequency the supply voltage, it is expedient that the vibrator 7' of the rotor 3 should be in the form of a vibrator of torsional oscillation (FIG. 18).

It should be noted that the selection of the structure of the vibrator depends on the entire set of requirements put before the piezoelectric motor. Thus, the vibrator 7 of the stator 2 exciting torsional and shear oscillation, shaped as a hollow cylinder (FIG. 6) offers more compact design, whereas the vibrator 7 (FIG. 2) shaped as a plate is the simplest to manufacture. With the vibrator exciting torsional oscillation, lower frequency of the supply voltage of the piezoelectric motor is provided for, whereas exciting of shear oscillation and longitudinal oscillation provides for a higher frequency of the supply voltage.

Piezoelectric motors with either a passive rotor 2 (FIGS. 2, 5, 7, 8, 9, 10) or a passive stator 3 (FIGS. 3, 16, 18), wherein only one type of acoustic oscillation is generated in one direction, cannot be reversed electrically, i.e the direction of rotation of the rotor cannot be reversed by changing over the outgoing leads. Therefore, such motors are referred to as irreversible. However, the motors with active rotor and stator (FIGS. 4, 17, 19), as well as the motors wherein the vibrator 7 (FIGS. 6, 11, 12, 14, 15) is adapted to generate simultaneously two types of oscillation are reversible, since in these motors with the outgoing leads having changed places the direction of rotation of the rotor 3 is reversed.

Taking into consideration the type of oscillation being excited and the wave propagation direction, it is possible to secure the vibrator 7 on the support 19 of the stator 2 with minimal losses of the acoustic energy, and that with using practically any solid materials. Thus, for example, the vibrator 7 is mounted on the support 19 (FIG. 19) in at least one minimum of oscillation speeds (see "Magnetic and Dielectric Devices" edited by G. V. Katz, "ENERGIYA" Publishers, Moscow, 1964).

It is known that in the case of longitudinal oscillation, shear oscillation and torsional oscillation the minimums of oscillation speeds are spaced by distances divisible by the dimension setting the operating frequency of the vibrator by the doubled number of the overtone. The dimension setting the operating frequency is measured in the direction of propagation of the acoustic wave, and the first minimum of oscillation speeds is spaced from the end of the vibrator by a distance $s$ $$s = S/2n,$$

where $S$ — is the frequency setting dimension;

$n$ — the number of the overtone of longitudinal oscillation.

In case of tending oscillation the first minimum of the oscillation speeds is spaced from the end of the vibrator bar by a distance $s$ which can be approximately calculated from the following expression:

$$s = S/2(n'+1),$$

where $n'$ is the serial number of the overtone of bending oscillation.

Figure 19:
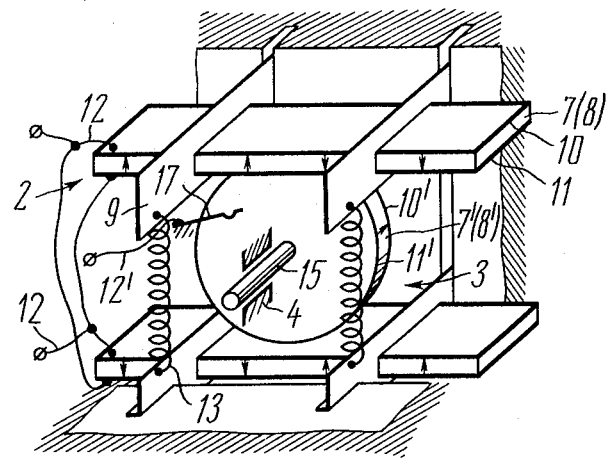
FIG. 19 shows the structure of a piezoelectric motor wherein several vibrators of the stator are mounted in movable frames, according to the invention.

Thus, mounting of the vibrator in the area of the minimum of the oscillation speeds can be effected by means of knife-type holders 9 (FIG. 2), or else in frame-type holders (FIG. 19). The vibrator 7 of the stator 2 can be secured to its holders, e.g. by means of an adhesive.

In addition to the piezoelectric device 8 (FIG. 2), the vibrator 7 of the stator 2 also is provided with a lining 18 made of a material which is not piezoelectric, but should be sufficiently wear-resistant. This lining is bound to the piezoelectric device to ensure acoustic contact between the rotor 3 and the stator 2, and the incorporation of this lining prolongs the operational life of the piezoelectric motor several times over. Thus, the operational life of the piezoelectric motor with a hardalloy lining is in excess of 2,000 hours. However, in applications where 100 hour long operational life is sufficient, it is possible to cut down the number of the components of the motor by having the vibrator 7 or 7', respectively, of the stator 2 and rotor 3 including only the piezoelectric device 8 or 8' (FIGS. 5, 6, 7, 8, 11, 12, 13, 14, 15, 16, 18, 19). In cases where the wear of the vibrator 7 (FIG. 4) of the stator 2 is considerably greater than that of the rotor 3, e.g. in the piezoelectric motors with active rotor and stator (FIG. 4), it is expedient to mount the lining 18 of a wear-resistant material solely on the stator 2, the vibrator 7' of the rotor 3 being in the form of a piezoelectric device 8' secured in the area of the minimum of the oscillation speeds on the shaft 15 of the rotor 3.

The shape of the lining 18 should ensure maximally reliable coupling therof with the piezoelectric device 8. This can be ensured, for instance, by connecting the lining 18 not only with the end face of the piezoelectric device 8, but also with either one (FIG. 20a) two (FIG. 29b) sides of the piezoelectric device 8 shaped as a plate. With the lining 18 (FIG. 20c) being shaped as a beak, the driving torque of the piezoelectric motor is somewhat increased.

When selecting the design of the piezoelectric motor, it is necessary to choose not only the type of the vibrator, but also the shape thereof. From the manufacturing point of view the most effective is a vibrator shaped as a rectangular plate (FIGS. 2, 4, 5, 7, 8, 11, 15, 19). However, in order to increase the efficiency factor of the motor, the vibrator 7 of the stator 2 is shaped as a bar with diminishing cross-sectional area, or else as a stepped-thickness body (FIG. 21), the rotor 3 engaging the vibrator 7 at the end thereof, having the minimal cross-section.

To reduce the overall dimensions of the motor, the vibrator 7 of the stator 2 can be shaped as a convolution of a spiral, the rotor 3 being received between the ends of this convolution, as is shown in FIG. 22. In this figure the dash line illustrates the shape of this convolution of the spiral prior to introduction of the rotor 3.

To reduce the dimensions of the piezoelectric motor and to broaden the range of its operating frequencies by employment of torsional, radial and shear oscllation, either the vibrator 7 (FIGS. 6, 9, 10, 12, 13, 14) of the stator 2 or the vibrator 7' of the rotor 3 (FIGS. 16, 17, 18, 21) is shaped as a hollow cylinder. The structure of the rotor 3 shaped as a hollow cylinder is also particularly suitable for piezoelectric motor which should be of a flat configuration, i.e. where the height should be considerably smaller than the diameter (FIG. 17.)

The abovedescribed structures of the vibrators by no means constitute the complete list of vibrators that can be employed, these structures are to be considered as the major ones which, when modified, do not improve any substantially the main ratings of the motor, such as the specific power applied to the shaft of the piezoelectric motor, the speed of rotation the efficiency factor, etc.

Thus, with the cylindrical shape being slightly distorted so that it becomes tapering, the linear speed at different points along the line of engagement of the rotor and stator varies, which results in noisy operation and in the ratings of the motor being affected. One should not consider the attachment of a wear-resistant lining 18 (FIG. 20) as variation of the shape of the vibrator, since the distortion this lining brings into the original shape of the vibrator is not aimed at optimizing the shape thereof but is simply necessary to ensure more strong connection between the wear-resistant lining 18 and the piezoelectric device 8. The same is true also of the linings 18 (FIGS. 9, 10) shaped as rings and associated with the piezoelectric devices 8 shaped as cylinders.

Figure 17:
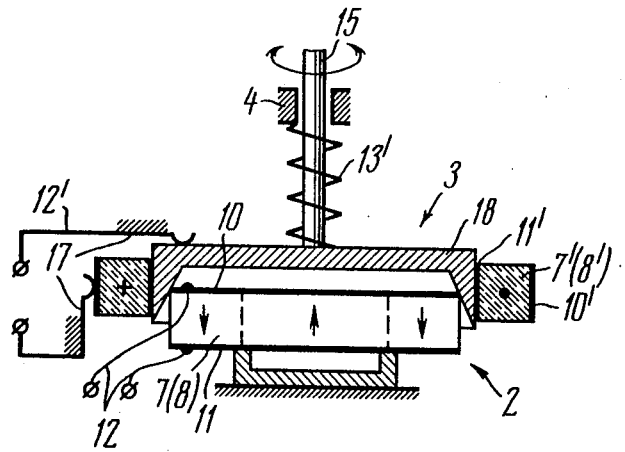
FIG. 17 shows a flat structure of a piezoelectric motor with an active rotor and an active stator, according to the invention.
Figure 18:
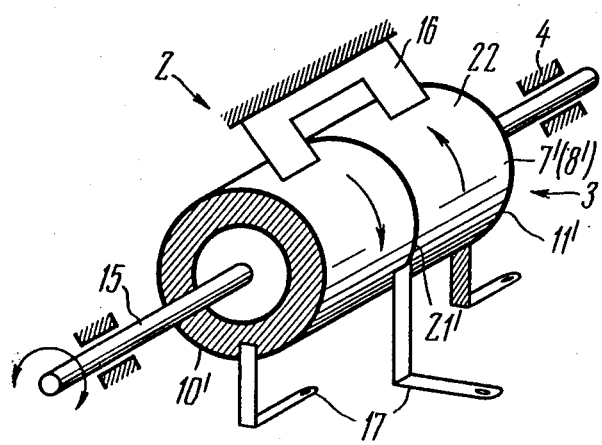
FIG. 18 shows the structure of a piezoelectric motor wherein torsional oscillation is generated in the vibrator of the rotor according to the invention.

It is expedient that the piezoelectric motors having their piezoelectric device 8 or 8' shaped as a hollow cylinder should have the lining 18 likewise shaped either as a hollow cylinder (FIGS. 9 and 10) or as a thin-wall sleeve with a bottom (FIGS. 17 and 21). The lining 18 is to be reliably secured to the piezoelectric device 8 or 8' with adhesive, solder or in other suitable manner, providing good acoustic coupling therebetween.

The abovedescribed shapes of the vibrators are the simplest ones. It is expedient that the piezoelectric device 8 should be likewise of a simple shape and, furthermore, that it should be the replica of the shape of the vibrator, i.e. it is expedient that the piezoelectric device 8 or 8' should be shaped as a rectangular plate (FIGS. 2, 4, 5, 7, 8, 11, 15, 19), as a bar with the diminishing cross-section, e.g. as a stepped body (FIG. 21), as a hollow cylinder (FIGS. 6, 9, 10, 12, 13, 14, 16, 17, 18, 21) or as a disc (FIGS. 3, 4, 17, 19) and so on.

Figure 15:
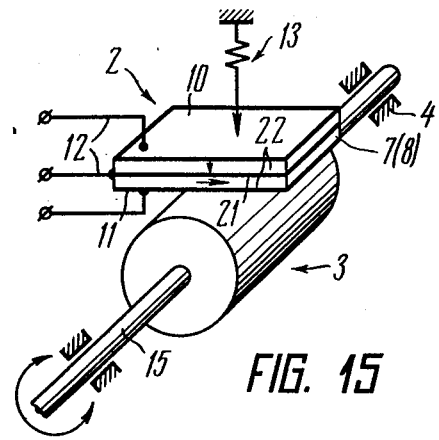
FIG. 15 shows the structure of a piezoelectric motor wherein there are generated in the vibrator of the stator longitudinal and shear types of oscillation, according to the invention.

In practice, there are required piezoelectric motors operable with relatively low supply voltage, such as that supplied by dry batteries and storage batteries with output voltage from 1 to 5 Volts. In such piezoelectric motors there can be used the vibrator 7 of the stator 2, wherein there are generated longitudinal oscillation and shear oscillation across the thickness (FIG. 15). The piezoelectric device 8 of the last-mentioned vibrator 7 is in the form of a two-layer plate having an electrode 21 intermediate of the layers 22 of this piezoelectric device 8. In the vibrator 7 (FIG. 23) of the stator 2, shaped as a plate, a metal layer 23 is acoustically connected to the surface of one of the electrodes 11 of the piezoelectric device 8, to step up the strength of the vibrator.

When the type of this vibrator, the shape thereof and the shape of the piezoelectric device have been selected, it is necessary to determine the required method of exciting the selected type of oscillation. This is done by selecting the direction of polarization of the material, the arrangement of the electrodes of the piezoelectric device and the electric connection of these electrodes. As it has been already mentioned hereinabove, in the appended drawings an arrow is used to indicate the direction of polarization. However, the direction of polarization indicated with the arrow in case of a piezoelectric device shaped as a hollow cylinder is true and has sense only if the piezoelectric device is made of a ferroelectric ceramic material, such materials being polarizable in any direction established at polarization. When depicting the direction of polarization of a hollow cylinder along the circumference the symbol ⊕ is used to denote the rear end of the arrow indicating the direction, while the symbol ⊙ denotes the front end of the arrow, which is the case, e.g. in FIGS. 6 and 14. Piezoelectric ceramics are less costly than piezoelectric crystals and, therefore, the former are preferable in practical applications from the point of view of the cost of the piezoelectric motors. On the other hand, crystaline piezoelectric materials, as a rule, feature better piezoelectric properties; therefore, wherever the requirements to be met by the electric ratings of the piezoelectric motors overrule the cost considerations, it is advisable to use crystalline materials for the piezoelectric devices of the vibrators, shaped as discs and plates.

Among piezoelectric substances which do not fall into the category of ferroelectrics, quartz offers high mechanical strength and high mechanical quality factor Therefore, it is expedient to use quartz for piezoelectric motors that have to yield high specific power developed at the shaft and high efficiency factor.

The abovedescribed shapes of vibrators and shapes of piezoelectric devices do not themselves unambiguously determine the type of acoustic oscillation excited in the vibrators. To have a complete description of a vibrator, it is necessary to know the way the piezoelectric device is polarized, the manner in which the electrodes have been applied and connected. The direction of the averaged vector of polarization and the plane of the electrodes. Thus, if it is stated that the piezoelectric device is polarized perpendicularly to its electrodes, it means that if an electric field is applied across these electrodes, the direction of the vector of the electric field at each point will coincide with the direction of the vector of polarization at this point. On the other hand, if the vector of polarization is perpendicular to the vector of the electric field at each point of the piezoelectric device, it can be stated that the piezoelectric device is polarized parallel with the electrodes.

To excite longitudinal oscillation and bending oscillation it is expedient that at least a portion of the piezoelectric device should be polarized perpendicularly to its electrodes (FIG. 11). In case of piezoelectric plates, discs, hollow cylinders and spirals polarization perpendicular to the electrodes can also be called polarization across the thickness (FIGS. 2, 3, 4, 5, 7, 19, 21, 22, 23).

To excite shear oscillation and torsional oscillation, it is expedient that at least a portion of the piezoelectric device should be polarized parallel with its electrodes. Thus, the piezoelectric device 8' (FIG. 16) is polarized parallel with the electrodes 10', 11', whereas the piezoelectric device 8 (FIG. 12) has a portion thereof polarized perpendicularly to the electrodes 11, 21 to excite longitudinal oscillation along the height of the cylinder, whereas the other portion is polarized parallel with the electrodes 10, 21 to excite torsional oscillation.

The abovedescribed examples of polarizaton of the piezoelectric device of the vibrator of a piezoelectric motor do not constitute the complete list of all the possible ways of polarization of piezoelectric devices. However, all such ways and methods are known per se and can be characterized by the following major principles:

1. The value of the input impedance of the piezoelectric device of a vibrator is the greater, the greater is the distance "L" between the electrodes 10 and 11 (FIG. 24) across which the electric field is applied. Thus, out of the three structures illustrated in FIG. 24 the lowest impedance is featured by the structure shown in FIG. 24a, whereas the greatest impedance is shown by the structure illustrated in FIG. 24c.

2. If a sample is polarized across its thickness, the input impedance of the piezoelectric device can be increased by dividing the piezoelectric device 8 (FIG. 25) into sections 24 and connecting these sections in series (FIG. 25a, b). However, this connection is effective only when the mechanical strain has the same general sense in every section. With the overtone number being two and higher (FIGS. 26 and 27) the mechanical strain periodically changes its sense, while passing through the minimum of mechanical strain (in the figures the distribution of the mechanical strain longitudinally of the plate is illustrated with the dash line). This should be remembered when the sections 24 are connected in parallel and provided for by either chaning the sense of polarizaton of the sections 24 (FIG. 26a) or by resorting to cross-connection of the electrodes (FIG. 26b).

With the sections 24 (FIG. 27) being connected in series, it is sufficient to divide the electrodes 10, 11 into several parts without changing the direction of polarization. The above discussed examples are applicable to generation of all types of oscillation in a piezoelectric device; however, the case of bending oscillation has certain peculiar features.

Bending deformation without longitudinal deformation can take place in a two-layer plate (FIG. 28) wherein the layers 22 are polarized across the thickness in one direction, the layers being connected in parallel. The same is true when the layers 22 are connected in series, their polarization being effected in opposite direction. With the serial connection of the layers 22 the impedance is increased four times, as compared with their parallel connection. A substantial increase of the input impedance of the piezoelectric device 8 is attained when the layers 22 are not separated by the electrode and are polarized longitudinally in opposite directions (FIG. 29). In this case, as well as in the case of a single-layer piezoelectric device with electrodes at the end faces thereof (FIG. 24c) the effect of conversion of the electric energy into mechanical power is at the maximum. However, the high input impedance of the piezoelectric device calls for a higher supply voltage, which narrows the field of applications of such piezoelectric devices in piezoelectric motors. Reduction of the input impedance of the piezoelectric device 8 is attained by dividing it (FIG. 30) into several layers 22 longitudinally of the device, separated by the electrodes 10 and 11 connected in parallel. In case of relatively thin piezoelectric devices it is expedient to apply the electrodes 10 and 11 (FIG. 31) by coating the surface of the plates with these electrodes either on one side or on two sides.

Unlike the hitherto known electric motors with continuous rotation of the rotor, the stator and the rotor of the piezoelectric motor are urged against each other. In structures with the passive stator 2 (FIG. 32) the rotor 3 and the stator 2 are urged against each other on account of the plates 16 of the stator 2 having been strained in advance by being elastically bent, as the rotor 3 was introduced into the stator 2. In a similar manner, i.e. by straining in advance the stator, there is attained urging of the rotor 3 (FIG. 22) against the stator 2 when the vibrator 7 is shaped as a convolution of a spiral.

However, in the majority of the designs of the piezoelectric motors the rotor 3 is urged against the stator 2 by means of a pressure or urging member 13 or 13'. In the simplest designs of the motors the pressure member 13 is in the form of a compression spring (FIGS. 7 and 8) mounted on the support 19 of the vibrator 7. To minimize the bias applied to the bearings 4, the pressure member 13 or 13' in the form of a spring can be mounted on the two vibrators 7 of the stator 2 (FIG. 19) or else of the rotor 3 (FIG. 12). A simple solution of the problem of urging the rotor 3 and the stator 2 against each other is employment of the pressure members 13' mounted on the shaft 15 (FIG. 14) of the rotor 3 and bearing against axially movable parts 26 of the rotor 3.

Alternatively, the pressure member 13 (13') can be in the form of a resilient gasket or a rubber plait. In case of the piezoelectric motors with relatively low power values at the rotor shaft the pressure member 13 (13') can be in the form of a permanent magnet (not shown in the appended drawings).

In the piezoelectric motors with the passive stator and in those with the active rotor and stator the outgoing leads of the piezoelectric devices 8' of the rotor 3 are connected to the voltage source via wiper contacts 17 (FIGS. 3, 4, 16, 17, 18, 19, 21). Usually, the latter are associated with commutator 3. Alternatively, the wiper contacts 17 can be urged directly to the electrodes 10', 11' (FIGS. 3, 16, 17, 18, 19) of the rotor 3, which simplifies substantially the structure of the piezoelectric motors. In one embodiment of the present invention the piezoelectric motor with the passive rotor has the stator 2 including the vibrator 7 (FIGS. 9 and 10) which is secured in the opening of the support 19 by means of an insulating layer 20, e.g. of cork.

The description of other structures of the piezoelectric motors embodying the invention will be continued in connection with the structures illustrated in the drawings mentioned herein below.

Figures 9, 10:
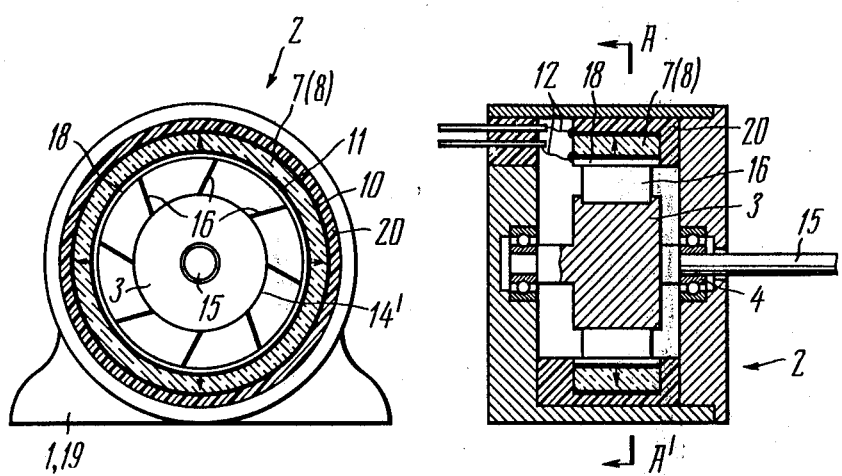
FIG. 9 is the front view of the structure of a piezoelectric motor wherein the vibrator of the stator is shaped as a hollow cylinder, according to the invention.
FIG. 10 is a side view of the structure of the piezoelectric motor illustrated in FIG. 9.

The piezoelectric motor with the passive rotor (FIGS. 9, 10 includes the vibrator 7 of the stator 2, shaped as a hollow cylinder. The piezoelectric device 8 of the vibrator 7 is likewise shaped as a hollow cylinder having secured to the internal cylindrical surface thereof the thin cylinder-shaped lining 18 made of a wear-resistant material.

In the presently disclosed structure of the piezoelectric motor the electrodes 10, 11 are applied by coating onto the cylindrical surfaces of the hollow piezoelectric cylinder polarized in a direction perpendicular to these electrodes. The stator 2 receives therein the rotor 3 on the shaft 15 of which the plates 16, e.g. of steel, are secured each by one its end, symmetrically relative to the axis of the rotr, the opposite ends of these plates bearing against the internal cylindrical surface of the stator 2 enveloping the rotor 3, in which way the rotor 3 and the stator 2 are resiliently urged against each other.

To provide for a lower operating frequency of the voltage source supplying the piezoelectric motor, the vibrator 7' (FIG. 32) of the rotor 3 is shaped as a disc. The piezoelectric device 8' of this vibrator is likewise shaped as a disc and has the electrodes 10', 11' applied by coating onto the flat faces thereof. This piezoelectric device is polarized across the thickness of the disc, the thin lining 18 made of a wear-resistant material being secured over the cylindrical surface of the disc. To provide for a lower voltage of the voltage supply source, the piezoelectric device 8' shaped as the disc is made up by several layers 22 (FIG. 33). The layers 22 extend parallel with the electrodes 10', 11' and are connected in parallel. The parallel connection of the layers 22 is preferably effected with conducting strips 27. The cylindrical surface of the piezoelectric device 8' has secured thereabove a thin-wall cylindrical lining 18 made of a ceramic wear-resistant material. The abovedescribed rotor incorporating the commutator rings 25 is received within the stator 2 (FIG. 32). The stator 2 is shaped as a hollow cylinder, the plates 16 being secured each by one its end internally of the cylinder symmetrically with respect to the axis of rotation of the rotor 3, the opposite ends of these plates bearing upon the surface of the rotor 3, the inherent resilience of the plates urging the rotor 3 and the stator 2 against each other.

The last-described structure of the piezoelectric motor with the passive stator can incorporate the rotor 3 of the piezoelectric motor with the active rotor and stator (FIG. 21), which rotor is shaped as a hollow cylinder polarized in the radial direction and having the electrodes 10', 11' on the cylindrical surfaces thereof, the rotor being received inside the lining 18 in the form of a thin-wall sleeve 18 made of a wear-resistant material. This modification of the structure of the piezoelectric motor with the passive stator provides for stepping up considerably the output power at the shaft of the motor.

To provide for a higher frequency of the supply voltage of the piezoelectric motor, the structure including the passive stator 2 (FIG. 32) can incorporate the rotor 3 (FIG. 16) adapted to generate shear oscillation, shaped as a hollow cylinder. Wherever necessary, the vibrator 7' of the rotor 3 is secured to the shaft (this securing is not shown in the drawing).

Considerably lower operative frequency of the piezoelectric motor is attained by the vibrator 7' of the rotor 3 (FIG. 18) being shaped as a hollow cylinder secured on the shaft 15. The piezoelectric device 8' of this vibrator 7' is made up by two layers 22 separated by the electrode 21 parallel with the endface electrodes 10', 11'. The layers 22 in this structure are polarized over the circumference in opposite directions, parallel with the electrodes 10', 11'.

The stator 2 incorporates a plate 16 secured in the support (not shown in the drawing), made of a hard resilient material and shaped as a fork. The prongs of the fork are urged by the internal bending strain to the surface of the rotor 3.

To render the piezoelectric motor reversible, it is made with the active rotor 3 and stator 2 (FIGS. 4, 17, 19, 21, 34). In the structure of the reversible piezoelectric motor, shown in FIG. 34, the stator 2 incorporates two vibrators 7 of longitudinal oscillation, adapted to excite the second overtone, the electrodes 10 of the two vibrators 7 being interconnected, the same as the electrodes 11 thereof. To provide for a higher supply voltage of the motor, the herein described structure includes the rotor 3 including the vibrator 7' shaped as a hollow cylinder. This rotor is preferably in the form of the rotor 3 (FIG. 21) of the piezoelectric motor with the stepped vibrator 7 of the stator 2. The stator 2 and the rotor 3 (FIG. 34) are urged against each other by the pressure members 13 mounted on the support (not shown in the drawing) of the stator and bearing against the respective surfaces of the vibrators 7 of the stator 2.

To reduce the overall dimensions of the piezoelectric motor and to step up the power output at its shaft, the vibrator 7 of the stator 2 is shaped as a hollow cylinder symmetrically enveloping the rotor 3 (FIGS. 35, 36). The piezoelectric device 8 of the vibrator 7 is likewise shaped as a hollow cylinder and has the electrodes 10, 11 on its cylindrical surfaces. As afar as the directions of polarization are concerned, the device is divided into an even number of portions (in FIG. 36 there are four such portions) which will be referred to as zones 28 and 28'. Each zone 28 and 28' of the piezoelectric device is polarized across the thickness, the directions of polarization of each adjacent pair of the zones being opposite. This structure of the piezoelectric device 8 ensures therein a resonance of longitudinal oscillation along the circumference of this piezoelectric device 8 at the overtone of which the number equals the number of the zones (the structure shown in FIGS. 35 and 36 ensures the resonance at the fourth overtone) To transmit the driving torque from the stator 2 to the rotor 3 of the piezoelectric motor, there are mounted on the internal surface of the hollow cylinder of the piezoelectric device, symmetrically with respect to the axis of rotation of the rotor 3, linings 18 made of a wear-resistant material. The number of the linings 18 equals half the number of the zones 28 and 28' m.e. equals two in the example described). It is expedient that the linings 18 should be isosceles triangle-shaped in cross-section, as shown in FIG. 35. The vibrators 7' of the rotor 3 associated with the presently described structure of the stator 2 are preferably in the form of two discs movably mounted on the shaft 15 of the rotor 3 for motion axially thereof. The vibrators 7' include the piezoelectric devices 8' shaped each as a hollow cylinder with the electrodes 10', 11' on the faces of the cylinders, the piezoelectric devices 8' being polarized perpendicularly to the electrodes 10', 11'.

The electrodes 10', as well as the electrodes 11' are interconnected, the two piezoelectric devices 8' being polarized in opposite directions. This arrangement and connection of the electrodes 10', 11' in combination with the polarization of the piezoelectric devices 8' provide for generation of co-phasal radial oscillation in the vibrators 7' of the rotor 3.

The side surfaces of the vibrator 7' (FIG. 35) of the rotor 3 have mounted thereon the ends of the pressure members 13' urging the vibrators 7' of the rotor 3 to the linings 18 of the vibrator 7 of the stator 2. In this manner the rotor 3 and the stator 2 are urged against each other. Hence, it is expedient that the two vibrators 7' of the rotor 3 should be arranged symmetrically relative to the vibrator 7 of the stator 2.

Among the advantages offered by the piezoelectric motors is the possibility of the motor having a flat structure. The flat piezoelectric motor (FIGS. 37 and 38) has the stator 2 with two vibrators 7 in the form of two-layer piezoelectric plates 29. Each plate 29 has centrally thereof an opening for the passage of the shaft 15 of the rotor 3. There are mounted on the shaft 15 of the rotor 3 the parts 26 of the rotor 3, shaped as two discs receiving therebetween the vibrators 7 of the stator 2.

The discs are mounted on the shaft 15 of the rotor 3 with pins 30, whereby they are movable axially of the shaft. The pressure member 13' in the form of a spring is connected to the discs to provide an effort urging the rotor 3 to the stator 2. In the presently described piezoelectric motor the piezoelectric device 8 of the vibrator 7 of the stator 2 is a two-layer plate 29 (FIG. 39) with the electrodes 11, 31 between the layers 22 and the electrodes 10, 21 on the external surfaces of the plate 29. The external electrodes 10, 21 and the electrodes 11, 31 of the two piezoelectric devices 8 (FIG. 38) are connected to each other and are also connected to the voltage source (not shown). Each plate 29 of the piezoelectric device 8 is polarized across its thickness, the directions of the polarization dividing the piezoelectric device into three zones 28, 28' and 32. The zone 32 with the electrodes 21, 31 includes one half of the piezoelectric device by its width and is polarized across the thickness in one direction. The other two zones 28 and 28' with the electrodes 10, 11 divide the other half of the piezoelectric device longitudinally into two parts, the layers 22 in each zone 28, 28' are polarized across the thickness in opposite directions and the zones 28 are polarized in opposite directions with respect to each other. The arrangement and the connection of the electrodes, as well as the direction of the polarization of this piezoelectric device provides for generation of the second overtone of longitudinal oscillation longitudinally of the device and the second overtone of bending oscillation across its width. The resonance frequency $f_n$ of the longitudinal oscillation can be found from the formula:

$$f_n = \frac{N_n}{S} ;$$

where $N_n$ is the frequency constant of the material.

In the case of the bending oscillation the resonance frequency $f_n$ is found from the formula, approximately:

$$f_n = \frac{\beta_1 \cdot a}{L^2} \sqrt{\frac{E}{\rho}}$$

$\beta_1 = 1.03$ — for the first overtone of bending oscillation;
$\beta_2 = 2.83$ — for the second overtone of bending oscillation;
where
  $a$ is the thickness of the piezoelectric device;
  $L$ is the length thereof,
  $E$ is the Young modulus of the material of the piezoelectric device,
  $\rho$ is its density.

In the presently described structure of the piezoelectric motor the two vibrators 7 of the stator 2 (FIGS. 37 and 38) are excited co-phasally, i.e. in a manner where the torque on each vibrator is added to the torque of the other vibrator.

This is ensured by the two piezoelectric devices 8 of the stoator 2 being connected in parallel and arranged so that the directions of their polarization are symmetrical with respect to the plane BB perpendicular to the shaft 15 of the rotor 3 and extending intermediate of the piezoelectric devices 8 of the stator 2.

The vibrators 7 of the stator 2 are mounted on the support (not shown) by means of pins 33 secured to the piezoelectric devices 8 at the areas of the minimum of the oscillation speeds of the longitudinal oscillation of the second overtone longitudinally of the respective devices.

In the electrically reversible piezoelectric device with the passive rotor 3 (FIGS. 6, 12, 15) the vibrator 7 incorporates the piezoelectric device 8 with the three electrodes 10, 11, 21. The electrode 21 in structures of this kind serves to excite two different types of oscillation and, therefore, is called the common electrode, whereas the two other electrodes, 10, 11 are provided to excite only one type of oscillation. To render the motor reversible, the common electrode 21 is connected to one pole of the voltage supply source 5 (FIG. 12), and the electrode 10 is connected directly to the other pole of the voltage source 5. The electrode 11 is connected to the voltage source 5 through a phase-shifting device 6, a single-pole switch 34 and an inverter 35, to the same pole of the voltage source 5 to which the electrode 10 is connected. The inverter 35 is preferably an electric power transformer.

In the embodiments of the piezoelectric motor, including two pairs of separate electrodes 10, 11 and 21, 31 (FIGS. 11, 14, 39), each pair exciting its own type of acoustic oscillation in the piezoelectric device 8 of the vibrator 7, the motor is reversed electrically by switching over two electrodes, e.g. the electrodes 10, 11, which is effected by a bi-polar switch 36 to which the electrodes are connected (FIG. 11), while the other pair 21, 31 is connected directly to the voltage source 5.

The electrically reversible piezoelectric motors with the active stator and rotor are connected in a similar way. The difference, however, is in that a bi-polar switch 36 (FIG. 11) is provided to which the electrodes 10', 11' are connected, while the electrodes 10, 11 are connected directly to the voltage source (not shown).

As a rule, the piezoelectric motor is connected into the circuit of a converter of D.C. voltage into A.C. voltage, with the frequency equalling the resonance frequency of the motor (FIGS. 40, 41). To provide the feedback connection in this converter, it is expedient that at least one electrode 37 should be employed as the feedback voltage source. To attain this, the electrode 37 is connected to the input of a transistor triode 38 which is itself the amplifying member in the feedback connection of the converter (FIG. 40). In the circuit of the D.C. voltage converter with two amplifying members — the two transistors 38 (FIG. 41) the piezoelectric device 8 is provided with two feedback electrodes 37. The last-mentioned circuit can do without the inductance 39 (FIG. 40) which is indispensable in the circuit with the one transistor 38.

The electrically reversible piezoelectric motor with two pairs of electrodes 10, 11 and 21, 31 (FIGS. 11 and 14) can operate with a single piezoelectric device 8.. In one of the possible structures of such a piezoelectric motor (FIG. 11) the latter includes the vibrator 7 of the stator 2 in the form of a two-layer piezoelectric device with two separate electrodes 21, 10. In each plane of the layer 22 the electrodes form in the piezoelectric device 8 two electrically unconnected zones 28, 32. The polarization of the layers 22 within the zone 32 is effected in one direction, whereas in the zone 28 it is effected in opposite directions, the metal coatings on the opposite external surfaces of the layers 22 of the piezoelectric device 8 being interconnected to form said electrodes 10, 21. The presently described structure of the piezoelectric device enables to have the vibrator 7 of the stator 2 operating with the first overtone of longitudinal oscillation longitudinally of the piezoelectric device and with the higher overtone of bending oscillation longitudinally of this device.

The last-described structure of the piezoelectric motor is also employed in the piezoelectric motor with several rotors (FIG. 42). This means that one stator 2 is associated with at least one additional rotor 40 (40') likewise urged against this stator. The effort urging the stator 2 and the rotors 3, 40, 40' to one another is provided by the resilience of the piezoelectric device 8 which is accordingly bent in advance, as the piezoelectric motor is being assembled. The incorporation of several rotors provides for transmitting driving torque to several consumers.

From the practical point of view, of interest are the structures where the parts 26 of the rotor 3 of the motor are shaped as bodies of rotation, e.g. as truncated cones (FIG. 6) mounted on the shaft 15 movably in the axial direction. To effect urging of the rotor 3 and the stator 2 against each other, the said parts 26 of the rotor 3 are urged to the lateral sides of the stator 2 by means of the pressure member 13 in the form of a spring mounted on these parts 26.

In a similar structure of the piezoelectric motor the two parts 26 of the rotor 3 (FIG. 43) are fixed on the shaft 15 of the rotor 3, the rotor 3 at any given moment engaging only one lateral side of the stator 2 by the respective one part 26 of the rotor 3. By shifting with the help of an arm 41 the entire rotor 3 in the axial direction, the direction of rotation of the motor can be reversed, in this case mechanically. This is done by applying a mechanical effort F to the arm 41 in the corresponding direction. However, in order to ensure that the motor can be reversed, the opposite end faces of the vibrator 7 of the stator 2, engaging alternatively the rotor 3, should correspond to opposite directions of rotation. This is ensured by the vibrator 7 of the stator 2 being shaped as a hollow cylinder with the electrodes 10, 11 being situated on the end faces of this hollow cylinder, polarization of one half of the piezoelectric device 8 being effected longitudinally of the cylinder, i.e. along the height thereof, the rest of the piezoelectric device being polarized circumferentially, parallel with the electrodes 10, 11.

The most simple structures of the piezoelectric motors can be reversed mechanically in the case of motor wherein the vibrator 7 of the stator 2 is shaped as a plate wherein longitudinal oscillation is excited. This is attained by the stator 2 (FIG. 44) being provided with two vibrators 7 mounted by their ends on a pivot 42, the opposite ends of the vibrators 7 receiving therebetween the rotor 3 which is selectively urged to the respective end of either one of the vibrators with the help of the reversing device 43. The reversing device 43 can include an electromagnet 44, in which case there is mounted on the end portion of one of the vibrators 7 a body 44' made of a material having ferromagnetic properties, which is attractable to the electromagnet 44 to reverse the direction of rotation of the motor.

Figure 1:
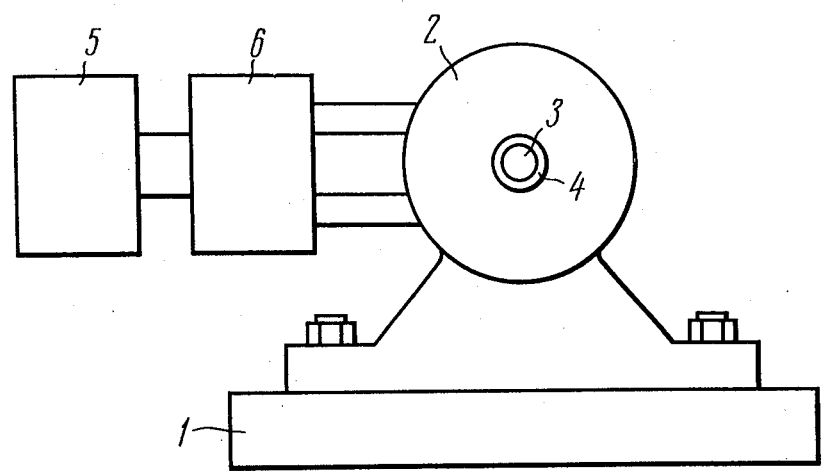
FIG. 1 illustrates the connection circuit of a piezoelectric motor in accordance with the invention.

It should be born in mind that the piezoelectric motor which is electrically reversible features optimal relationship between the phases of the types of oscillation excited in the vibrator. Therefore, it is expedient that at least one pair of the electrodes should be connected via the phase-shifting device 6 (FIG. 1). This can be done with the pair of the electrodes 10, 11 (FIG. 4), the pair of the electrodes 10, 21 (FIG. 15) the pair of the electrodes 10, 11 (FIG. 39).

It should be also born in mind that in the herein disclosed piezoelectric motors, the same as in electric motors of other kinds, the rotor and the stator can change places.

This is done by securing the rotor in a fixed position, whereby it becomes a stator, whereas the former stator starts rotating and actually becomes the rotor. If the former stator had contained the vibrator, the latter is supplied with electric power by being provided with wiper contacts. On the other hand, the wiper contacts of the former rotor can be dispensed with.

Like the electric motors based on interaction of magnetic fields, the piezoelectric motors present a two-way convertible system, in a sense that when the shaft 15 (FIG. 45) of the rotor 3 of the piezoelectric motor is coupled to an external prime mover 45 and at least one pair of the electrodes of at least one vibrator is connected to an electric load 46, A.C. voltage appears across this load. This is true of every structure of the herein disclosed piezoelectric motors, whereby all of them, when operated as power generators, can be used as winding-less transducers of mechanical energy into electric power.

However, if the electrically reversible piezoelectric motors are selected from all the herein disclosed structures, they can be employed as actual generators of electric power for supply purposes (FIGS. 46, 47, 48). To attain this, the pair of the electrodes 10, 21 (FIG. 46) of the piezoelectric device 8 of the vibrator 7, serving to excite oscillation varying the effort of urging the rotor 3 to the stator 2, is connected to a voltage source 5, whereas the other pair of the electrodes 11, 21, which had served to create the rotor-driving effort to rotate the rotor 3, is connected to the load 46.

In the piezoelectric motor having one piezoelectric device 8 with three outgoing leads (FIGS. 12, 15) the electrode 10 and the common electrode 21 serve to excite oscillation varying the effort with which the rotor 3 is urged to the stator 2, while the electrode 11 and the common electrode 21 serve to create the effort driving the rotor 3. Therefore, when the last-mentioned piezoelectric motor is operated as a power generator, the electrodes 10, 21 (FIG. 46) are connected to the voltage source 5, while the electrodes 11, 21 are connected to the load 46. In the piezoelectric motor with four electrodes (FIG. 6, 11, 14, 37, 38) the electrodes 21, 31 (FIG. 47) are connected to the electric load 46.

In the piezoelectric motor with the active rotor and stator (FIGS. 4, 17, 19, 21, 34, 35, 36) the electrodes 10', 11' of the piezoelectric device 8' of the rotor 3 are connected to the voltage source 5, while the electrodes 10, 11 of the piezoelectric device 8 of the stator 2 are connected to the load 46, as is illustrated in FIG. 48.

The herein disclosed piezoelectric motor with the polarized rotor operates, as follows.

When the piezoelectric motor is connected to the A.C. voltage source 5 (FIG. 1), voltage is supplied across the electrodes 10, 11 (FIG. 2) of the piezoelectric device 8 of the vibrator 7. Owing to the reverse piezoelectric effect, this voltage is converted into mechanical oscillation, the vibrations propagating in the vibrator 7 and exciting mechanically every point of this vibrator. After having been reflected by the interface of the vibrator 7 and the ambient medium, the mechanical vibrations advance in the reverse direction, thus forming forward and reverse waves of acoustic oscillation.

At frequencies approaching the resonance ones all the direct and reflected waves add up to form a standing wave of mechanical vibrations. If one half of the length of this wave occupies the length of the vibrator 7, the first overtone resonance takes place; if two half-waves occupy this length, the second overtone resonance of mechanical vibrations takes place, and so on. The distribution of the oscillation speeds longitudinally of the vibrator 7 corresponds to a cosine curve, so that the maxima of oscillation speeds are always at the end faces of the vibrator. The lining 18 which is thus at the area of the maximum of the oscillation speeds transmits the oscillation energy to the rotor 3, the energy being converted into continuous rotation of the rotor 3. Thus, the lining 18, as it engages the surface of the rotor 3, in the course of its longitudinal motion has to deviate from the translatory motion and, hence, moves along the surface of the rotor 3 pulling the latter therealong by friction forces. Therefore, the rotor receives a driving rotating pulse in a direction indicated in FIG. 2 by the arrow. While deviating from the longitudinal motion, the lining 18 acquires a pulse of lateral motion, i.e. a bending pulse. This bending pulse is reflected from the interface of engagement of the rotor 3 and stator 2 and propagates longitudinally of the vibrator 7 at the rate of propagation of bending waves, there taking place at one of the higher overtones of the bending oscillation the resonance of this oscillation. Thus, it appears that the points of the vibrator 7, contacting the rotor 3, oscillate in two perpendicular directions, whereby these points move along elliptical paths. In the special case when these paths are circles, the last-mentioned points in fact form a rotating shaft which is in engagement with the rotor 3 and, therefore, transmits its rotation thereto. The greater the amplitude of the oscillation, the greater is the diameter of this "driving shaft" and, consequently, the faster is rotation of the rotor 3. On the other hand, the greater is the frequency of the oscillation, the greater is the angular speed of this "shaft" and, consequently, the greater is the speed of rotation of the rotor 3. Furthermore, the smaller the diameter of the rotor 3, the higher its speed of rotation. Therefore, the rotary speed of the herein disclosed piezoelectric motor depends on the dimensions of the rotor 3 and is also proportional to the amplitude and frequency of the oscillation. By controlling the amplitude of the oscillation and the frequency of the power supply of the motor, it is possible to have motors running at speeds from several to thousands revolutions per minute.

The abovedescribed operating principle of the piezoelectric motor is not the only one explaining its work. The second explanation of the operating principle of the piezoelectric motor with the passive rotor is the jamming or wedging effect. This effect resides in that with the rotor 3 rotating, e.g. counter-clockwise it becomes jammed, while with the rotor 3 rotating clockwise it becomes unjammed. The effect of jamming means that the end of the vibrator 7, urged against the rotor 3, is subjected to a torque forcing it into the gap between the vibrator itself and the rotor 3. In other words, in a model presentation it looks as if the vibrator 7 is somewhat spaced from the rotor 3, and a wedge is introduced into the clearance therebetween. With the rotor 3 rotating clockwise the wedge is pulled into the gap, and with the rotor rotating in the opposite direction the wedge is pushed out of this gap. This jamming or wedging effect results in that with the end of the vibrator 7 moving forward with the rotor 3, the forces of friction are considerably greater than those accompanying the return motion of the end of the vibrator.

Thus, the rotor 3 is driven forward, whereas during the return motion the end of the vibrator 7 slips on the rotor.

Another operating principle is embodied in the piezoelectric motor with the passive stator (FIG. 3). With the rotor 3 being connected through the wiper contacts 17 to the voltage source (not shown in the drawing), resonance radial oscillation is excited in the piezoelectric device 8'. As a result, each point on the surface of the piezoelectric device 8' moves along the radius of the circle of the piezoelectric device 8'. When colliding with the plate 16 of the stator 2, the point of the engagement acquires a pulse of motion circumferentially of the rotor 3. This effect is similar to the effect of head-on collision of two cars. It is known that when two cars collide head-on, their front ends are lifted. For a similar reason the point of engagement of the rotor 3 with the stator 2 is likewise "lifted", imparting a driving rotating pulse to the rotor 3. The situation that follows is similar to that taking place in the structure with the passive rotor 3 (FIG. 2), i.e. the motion of the point of engagement of the rotor 3 and the stator 2 results in periodic bending of the plate 16, and so on. Of no minor importance is here the jamming or wedging effect, resulting in the reduction of the friction forces, as the point of engagement of the rotor 3 and the stator 2 is moving toward the centre of the piezoelectric device 8.

Quite simple is the operation of the piezoelectric motor with the active rotor 3 and the active stator 2 (FIG. 4). In this structure one of the maxima of the oscillation speeds falls on the centre of the plate of the vibrator 7, because in the piezoelectric device 8 thereof there is excited the second overtone of longitudinal oscillation. Therefore, the lining 18 secured on the stator 2 oscillates in a horizontal direction and transmits a driving torque pulse to the rotor 3, as it engages the latter. The oscillation in the piezoelectric device 8' of the rotor 3 varies the effort urging the rotor 3 and stator 2 against each other. If the engagement takes place at the moment when the lining 18 moves to the right, the rotor 3 rotates clockwise. It is sufficient to switch over the leads of the piezoelectric device 8 (or 8'), and the engagement will take place at the moment when the lining 18 moves to the left, whereby the rotor 3 will rotate counter-clockwise.

In the structures of the piezoelectric motors where two types of oscillation are electrically excited in one vibrator, one type of oscillation varies the effort urging the rotor 3 to the stator 2, while the other type of oscillation imparts driving pulses to the rotor 3. For example, in the structure of the vibrator 7 (FIG. 6) employing torsional oscillation and shear oscillation across the thickness of the hollow cylinder, the torsional oscillation imparts the driving torque to the rotor 3, while the shear oscillation effects engagement between the rotor 3 and the stator 2.

In the structure of the piezoelectric motor wherein there are excited in the vibrator 7 (FIG. 11) longitudinal oscillation and bending oscillation, the bending oscillation varies the effort urging the rotor 3 and the stator 2 against each other. In the structure incorporating the vibrator 7 (FIG. 12) using torsional oscillation and longitudinal oscillation along the height of the hollow cylinder, the last-mentioned type of oscillation effects variation of the effort with which the rotor 3 and stator 2 are urged against each other.

In the structure of the piezoelectric motor with the vibrator 7 of the stator 2 (FIG. 13), wherein there are excited longitudinal and radial types of oscillation, it is the longitudinal oscillation which varies the effort or urging the rotor 3 to the stator 2.

In the structure of the piezoelectric motor with the vibrator 7 wherein there is excited shear oscillation in two directions (FIG. 14), the shear oscillation across the thickness of the hollow cylinder in the circumferential direction imparts a driving pulse to the rotor 3, whereas the shear oscillation across the thickness in the direction of the generatrix of the cylinder effect variation of the effort urging the rotor 3 to the stator 2.

In the structure of the piezoelectric motor with the vibrator 7 wherein there are excited longitudinal oscillation across the thickness of the piezoelectric device 8 and shear oscillation across the thickness of the piezoelectric device 8 (FIG. 15), it is the longitudinal oscillation which effects variation of the effort of urging the rotor 3 to the stator 2.

In the structure of the piezoelectric motor with the vibrators 7 of the stator 2, in each of which there are excited longitudinal oscillation along the length and bending oscillation across the width of the vibrator 7 (FIGS. 37, 38), variation of the effort urging the rotor 3 to the stator 2 is effected by the bending oscillation.

In the piezoelectric motors with the active rotor 3 and stator 2 variation of the effort urging the rotor 3 and stator 2 against each other is effected, as a rule, by the rotor 3. Thus, in the structures with the active rotor 3 and stator 2 (FIGS. 19, 21, 35, 36) variation of the effort urging the rotor 3 and stator 2 against each other is effected by the vibrator 7' of the rotor 3, wherein radial oscillation is excited. In the structure of the piezoelectric motor with the vibrator 7 (FIG. 17) of the stator 2, where radial oscillation of the third overtone is excited, it is the vibrator 7 of the stator 2 which effects variation of the effort urging the rotor 3 and stator 2 against each other. In this case the selection of the higher overtone of the radial oscillation is explained by the necessity of ensuring coincidence of the high-frequency shear oscillation with the relatively low-frequency radial oscillation.

The operation of the piezoelectric motor with several vibrators 7 (FIG. 5) mounted on the stator 2 does not differ in principle from that of the motor with one vibrator (FIG. 2). However, the power developed at the output shaft of the motor rises in proportion with the amount of the vibrators 7 and can be as high as dozens of Watts at the motor shaft.

The arrangement on either the stator 2 or on the rotor 3, instead of one plate (FIG. 3), of several plates 16 (FIG. 9, FIG. 10, FIG. 32) does not change the principle of operation of the piezoelectric motor, but reduces the wear of the plates and steps up the effectiveness of conversion of the mechanical energy of the vibrator 7 into the rotary energy of the rotor 3, which enhances the overall efficiency factor of the piezoelectric motor. With several rotors 3, 40 and 40' connected to an electric supply source (FIG. 42), the overall efficiency factor of the piezoelectric motor also increases as well as the ratio of the useful power output to the energy losses in the vibrator 7.

The torque developed at the output shaft of the piezoelectric forces is influenced to a great degree by the effort urging the rotor 3 and stator 2 against each other.

In the simplest structures wherein the rotor 3 (FIGS. 7 and 8) is urged to the stator 2 at one area the effort produced by the pressure member 13 is transmitted to the bearings 4, thus accelerating their wear. In the structures where the rotor 3 contacts the stator 2 at several areas symmetrically arranged around the circumference (FIGS. 9, 10, 16, 19, 22, 32, 34, 35, 36, 37, 38) the wear of the bearings 4 is precluded, on account of mutual compensation of all the efforts acting from the rotor 3 onto the bearings 4. It is even sufficient to ensure urging of the rotor 3 and stator 2 against each other at three areas, for the piezoelectric motor to operate without the bearings altogether.

Figure 14:
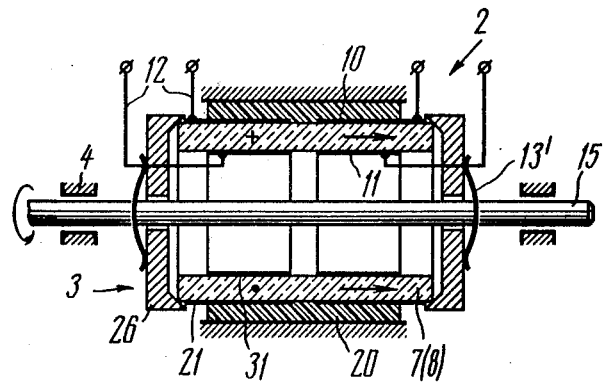
FIG. 14 shows the structure of a piezoelectric motor wherein there is generated in the vibrator of the stator shear oscillation in two perpendicular planes, according to the invention.

In the structures of the piezoelectric motors wherein the pressure member 13' is mounted on the shaft 15 (FIG. 17) and is arranged intermediate of the bearing 4 and the rotor 3, the effort of the pressure member 13' somewhat brakes the rotation of the rotor 3. This situation is eliminated when the member 13' is mounted on the rotor 3 (FIGS. 6, 12, 37, 38). It is likewise eliminated by mounting two pressure members 13' on the rotor 3 (FIGS. 14, 35, 36).

When two types of oscillation are excited in the reversible piezoelectric motor, the optimal relationship between the phases of the types of oscillation effecting, respectively, transmission of the driving torque and variation of the effort urging the rotor and stator against each is not always attained. Therefore, to be able to correct this phase relationship, it is expedient that the pair of the electrodes 11, 21 (FIG. 12) responsible for exciting one type of the oscillation should be connected to the voltage source through the phase-shifting device 6. Considering that, as a rule, the power consumed by variation of the effort urging the stator and rotor against each other is substantially smaller than that consumed by creation of the driving torque applied to the rotor 3, it is expedient that the phase-shifting device 6 should be connected to the electrodes responsible for variation of the effort urging the rotor and stator against each other.

To reverse the rotation of the motor having the stator 2 (FIG. 43) in the form of the hollow cylinder, the arm 41 is rotated through a specified angle to displace the rotor 3 correspondingly. For example, in this case there are excited in the piezoelectric device 8 an odd, e.g. the third overtone of torsional oscillation and the first overtone of longitudinal oscillation (along the generatrix of the cylinder). This combination of the numbers of the overtones corresponds to opposite directions of rotation of the rotor 3 when it is urged to the stator 2, respectively, from the left and from the right.

In the structure of the mechanically reversible piezoelectric motor (FIG. 44) the vibrator 7 of the stator 2 initially or normally effects rotation of the rotor 3 clockwise. When the reversing device 43 is energized, the body 44' is attracted. Overcoming the action of the pressure member 13, this force of attraction disengages the rotor 3 from one vibrator 7 and engages the rotor 3 with the other vibrator 7, whereby rotation of the rotor 3 is reversed.

One of the characteristic features of the herein disclosed piezoelectric motors is their ability to operate within a broad range of supply voltage values. It is important that this has been made possible not at the price of complicating the structure of the motors, such as increasing the number of coils, etc. but by selecting the optimal structure of the piezoelectric device itself. Thus, if it is necessary to operate with a voltage source with a greater output voltage, the voltage is applied across the width of the piezoelectric device (FIG. 24 b) or else across the length of the piezoelectric device (FIGS. 24 c, 29). The supply voltage can be increased two to five times, if the parts of the piezoelectric device are correspondingly connected in series (FIGS. 25, 27, 28 b).

Many of the abovementioned advantages of the piezoelectric motors remain when they are operated in the mode of generating electric power. The operation of the irreversible motors in the power generation mode is based on the following phenomena. When the rotor 3 (FIG. 2) is being rotated in the jamming direction, there is effected jamming, and, consequently, compression of the vibrator 7 of the stator 2. This compression rises to a certain value, whereafter the vibrator disengages itself. Then the rotor 3 slips through a certain small angle, while the vibrator 7 restores its original state, which is accompanied by longitudinal and lateral oscillation. One type of the oscillation, the one which creates the driving torque applied to the rotor 3 when the same motor is operated as a prime mover, is converted by the direct piezoelectric effect into an electric signal. The spectrum of this signal usually containes several overtones, whereby the power of the generated signal is sufficient merely for registration of the rotation of the rotor 3; for this reason these structures can be used as rotation transducers, e.g. for measuring the speed of rotation of the motor.

By affording some amount of power from the external source 5 (FIGS. 46, 47, 48) of electric power for exciting the type of oscillation in the vibrator either of the stator 2 (FIGS. 46, 47) or of the rotor 3 (FIG. 48) which effects engagement of the rotor 3 with the stator 2, it is possible to have the generator capable of producing electric power. In this case the rotating rotor 3 transmits pulses of mechanical energy to the piezoelectric device 8 with the frequency which controls the engagement. These pulses excite the vibrator 7 at the same frequency of engagement and are converted in the piezoelectric device 8 into an electric signal having the frequency which is the operating frequency of the piezoelectric motor.

Employment of the herein disclosed piezoelectric motors as power generators can be practical when small amounts of power are required. They are easily compatible with drives running at relatively low angular speeds, their advantages being the simple structure and the high output frequency.

The creation of the piezoelectric motors is to be considered as a qualitative breakthrough not only in the art of motor construction, but in the electrical engineering, as a whole. The possibility of obtaining low speeds without auxiliary transmissions, the absence of windings and the resulting greatly simplified manufacture, low production costs, inflammability, the availability of simply manufactured mini-motors offering the parameters and ratings that are offered by considerably greater hitherto known motors of power output in excess of 1 Watt, the simplicity of the conversion circuits when D.C. voltage sources are used, the possibility of obtaining the cosine of loss angle equalling 1.0 by connection of a small-size inductance, the provisions for controlling the speed of rotation by varying the supply voltage and frequency, as well as the phase relationship, the ready stabilization of the speed of rotation by selecting a high operating frequency, the high efficiency factor in excess of 50% and, as calculations show, even as high as 90% and higher with the corresponding piezoelectric materials, the high specific power output at the shaft, in excess of 0.2 W per cubical centimetre, the wide range of output power ratings from 0.001 W to dozens Watt — all these major advantages of the piezoelectric motors not only allow them to compete with the hitherto known motors, but also broaden the overall range of applications of electric motors. Thus, there are grounds to believe that the development of integral circuitry and electronic components and circuits in combination with the piezoelectric motors and advances in the art of power sources will raise our civilization to a higher level characterized by replacement of the human effort with independent mobile "robot"-like systems.

What we claim is:

1. An electric motor comprising a stator and a rotor; at least one of them including at least one vibrator having acoustically resonant elements incorporating a piezoelectric device; said piezoelectric device including electrodes having outgoing leads connected to an external voltage source, and means urging said stator and said rotor yieldably against each other at least at one point on the surface of said vibrator for transmission of the driving torque during one direction of oscillation while providing space separation between the vibrator and the rotor during the other direction of oscillation.

2. Electric motor according to claim 1 wherein said rotor is mounted on said stator by means of at least one bearing.

3. Electric motor according to claim 1, wherein said rotor is shaped as a body having a part of the surface thereof engaging said stator formed by rotation of at least one stretch of a straight line about the axis of rotation of said rotor.

4. Electric motor according to claim 1, wherein said stator is shaped as a body having a part of the surface thereof engaging said rotor, formed by rotation of at least one stretch of a straight line about the axis of rotation of said rotor.

5. Electric motor according to claim 1, wherein said rotor is shaped as a body of rotation.

6. Electric motor according to claim 1, wherein said stator is in the form of a vibrator.

7. Electric motor according to claim 1, wherein said vibrator is mounted on a support by a substance of which the product of the density by the Young modulus is less than one tenth of a similar product pertaining to the material of the piezoelectric device of said vibrator.

8. Electric motor according to claim 1, wherein said stator includes a vibrator of longitudinal oscillation.

9. Electric motor according to claim 1, wherein said stator includes a vibrator of radial oscillation.

10. Electric motor according to claim 1, wherein said stator includes a vibrator of longitudinal oscillation and bending oscillation.

11. Electric motor according to claim 1, wherein said stator includes a vibrator of torsional oscillation and radial oscillation.

12. Electric motor according to claim 1, wherein said stator includes a vibrator of torsional oscillation and longitudinal oscillation.

13. Electric motor according to claim 1, wherein said stator includes a vibrator of shear oscillation in two perpendicular directions.

14. Electric motor according to claim 1, wherein said stator includes a vibrator of shear oscillation and longitudinal oscillation.

15. Electric motor according to claim 1, wherein said rotor includes a vibrator of radial oscillation.

16. Electric motor according to claim 1, wherein said rotor includes a vibrator of shear oscillation.

17. Electric motor according to claim 1, wherein said rotor includes a vibrator of torsional oscillation.

18. Electric motor according to claim 1, wherein said vibrator is secured to the support in at least one oscillation velocity mode.

19. Electric motor according to claim 1, wherein at least the vibrator of said stator is in the form of said piezoelectric device.

20. Electric motor according to claim 1, wherein the vibrator of said rotor is in the form of said piezoelectric device.

21. Electric motor according to claim 1, wherein at least the piezoelectric device of the vibrator belonging to said stator is provided at the area of engagement of said rotor and said stator with a lining made of a wear-resistant material acoustically connected to said piezoelectric device.

22. Electric motor according to claim 1, wherein said vibrator is shaped as a rectangular plate.

23. Electric motor according to claim 1, wherein the vibrator of said stator is in the form of a rod with a diminishing cross-sectional area, said rotor engaging said vibrator at the end thereof, where the cross-section is minimal.

24. Electric motor according to claim 1, wherein the vibrator of said stator is shaped as a convolution of a spiral, said rotor being received between the ends of said convolution of the spiral.

25. Electric motor according to claim 1, wherein the vibrator of said stator is shaped as a hollow cylinder.

26. Electric motor according to claim 1, wherein the vibrator of said rotor is shaped as a hollow cylinder.

27. Electric motor according to claim 1, wherein the vibrator of said rotor is shaped as a cylinder.

28. Electric motor according to claim 1, wherein the piezoelectric device and the vibrator is shaped as the vibrator itself.

29. Electric motor according to claim 21, wherein said lining made of a wear-resistant material is shaped as a thin-wall cylinder.

30. Electric motor according to claim 1, wherein said piezoelectric device in made up by at least two layers acoustically connected with each other and separated by at least one electrode.

31. Electric motor according to claim 1, wherein a metal layer is acoustically connected to the surface of at least one of said electrodes.

32. Electric motor according to claim 1, wherein said piezoelectric device is made of a ferroelectric piezoelectric material.

33. Electric motor according to claim 32, wherein said piezoelectric device is made of a ceramic material.

34. Electric motor according to claim 32, wherein at least a portion of said piezoelectric device is polarized perpendicularly to the electrodes thereof.

35. Electric motor according to claim 32, wherein at least a portion of said piezoelectric device is polarized parallel with the electrodes thereof.

36. Electric motor according to claim 1, wherein said stator and said rotor are urged against each other by at least one resilient member.

37. Electric motor according to claim 36, wherein said resilient member has one end thereof mounted on the support of the vibrator and the other end thereof mounted on the vibrator itself.

38. Electric motor according to claim 36, wherein said resilient member has the ends thereof mounted on for vibrators of said stator.

39. Electric motor according to claim 36, wherein said resilient member is mounted on said rotor.

40. Electric motor according to claim 1, wherein said electrodes of the piezoelectric device of the vibrator of said rotor have urged thereto wiper contacts through which voltage is supplied to said piezoelectric device.

41. Electric motor according to claim 26, wherein said electrodes are applied by coating on the cylindrical surfaces of said hollow cylinder, the piezoelectric device itself being polarized in a direction perpendicular to these electrodes.

42. Electric motor according to claim 1, wherein said piezoelectric device is shaped as a disc polarized across the thickness thereof and having the electrodes on the flat faces of said disc.

43. Electric motor according to claim 30, wherein the layers of said piezoelectric device extend parallel with the external electrodes thereof and are connected with one another in parallel, any two adjacent layers being polarized in opposite directions.

44. Electric motor according to claim 1, wherein said rotor is received within said stator, said stator being shaped as a hollow cylinder having plates mounted therein symmetrically relative to the axis of rotation of said rotor and connected by their ends to said stator, the other ends of said plates bearing upon the surface of said rotor.

45. Electric motor according to claim 1, wherein said stator envelopes said rotor, plates being mounted by their ends on the shaft of said rotor symmetrically with respect to the axis of rotation thereof, the other ends of said plates bearing upon the surface of said stator.

46. Electric motor according to claim 1, comprising two piezoelectric plates extending parallel with each other and symmetrically receiving said rotor therebetween, said plates being urged against said rotor by two springs mounted on four frames having said plates secured therein, each frame being spaced by one fourth of the length of the plate from the end thereof, said frames being freely movable in four slots of a support, said plates having electrodes on the flat surfaces thereof and being polarized across the thickness in two perpendicular directions and in the same direction relative to each other, the external ones of said electrodes being interconnected, and the internal ones of said electrodes being likewise interconnected.

47. Electric motor according to claim 1, wherein the piezoelectric device of said stator symmetrically envelopes therein said rotor and has electrodes on the surfaces thereof, said piezoelectric device being polarized in opposite directions, perpendicular to said electrodes, so that this polarization divides said piezoelectric device into an even number of equal parts at the interfaces of which there are mounted linings of a wear-resistant material, internally of said piezoelectric device and symmetrically, the number of said linings being one half of the number of said parts.

48. Electric motor according to claim 1, wherein there are mounted on the shaft of said rotor, symmetrically with respect to said stator, two piezoelectric devices with the electrodes on the side surfaces thereof, said devices being movable in the axial direction and being polarized perpendicularly to said electrodes, said piezoelectric devices being urged against the linings of said stator, made of a wear-resistant material and shaped in cross-section as isosceles triangles, the internal, as well as the external electrodes of the piezoelectric devices being interconnected, said piezoelectric devices being polarized in opposite directions relative to each other.

49. Electric motor according to claim 1, wherein said stator includes two vibrators made in the form of two-layer piezoelectric plates with openings therethrough, said rotor being urged against these plates and having the shaft thereof extending through said openings, the piezoelectric device being a vibrator of the second overtone of longitudinal oscillation along the length of the plate and of the second overtone of bending oscillation across the width of the plate.

50. Electric motor according to claim 1, wherein the piezoelectric device comprises the common electrode connected to one pole of the external voltage source and one electrode for exciting one type of oscillation, connected to the other pole of this voltage source, the second electrode for exciting another type of oscillation being connected through a selector switch with the first electrode directly and through an inverter.

51. Electric motor according to claim 1, wherein four electrodes are provided for said piezoelectric device, connected to said external voltage source, two of said electrodes being adapted to excite one type of oscillation and being directly connected to said voltage source and two other electrodes, adapted to excite another type of oscillation, are connected to said voltage source through a bi-polar selector switch.

52. Electric motor according to claim 1, wherein said piezoelectric device includes at least one additional electrode connected to a load.

53. Electric motor according to claim 1, wherein the vibrator of said stator includes a two-layer piezoelectric device with two electrodes in each plane of the layers, said piezoelectric device having two electrically unconnected zones, with the layers in one zone being polarized in one direction and in the other zone in opposite directions, the external coatings within each zone being interconnected.

54. Electric motor according to claim 1, comprising at least one additional rotor urged against said stator.

55. Electric motor according to claim 1, wherein the shaft of said rotor passes through said stator and has mounted thereon, symmetrically at both side of said stator two bodies of rotation, which are axially movable and are urged to the lateral sides of said stator.

56. Electric motor according to claim 1, wherein said stator is provided with two vibrators mounted by their ends on a pivot, said rotor being received between said two vibrators and being urged against the end of one of said vibrators by a reversing device.

57. Electric motor according to claim 56, wherein said reversing device includes an electromagnet and a portion of an electromagnet mounted on the end of one of said vibrators.

58. An electric power generator including an electric motor in accordance with claim 1, said rotor thereof being connected to a drive adapted to rotate said rotor, at least one pair of the electrodes of at least one said vibrator, adapted to excite one type of oscillation, being connected to an electric load.

59. An electric power generator according to claim 58, wherein the electric motor has a second pair of said electrodes, of which one electrode belongs to said first pair of said electrodes, and is connected to an external voltage source.

60. Electric power generator according to claim 58, wherein the electric motor has a second pair of said electrodes, adapted to excite another type of oscillation, connected to an external voltage source.

61. Electric motor according to claim 1, wherein said stator is provided with two vibrators which are fastened at one end to a pivot, said rotor being positioned between the said vibrators, the vibrators due to the action of mechanical forces from an external power element constituting a reverse means can turn in the pivot to produce sequential pressing of the free ends of the vibrators against the rotor in order to change the direction of motion.

* * * * *